US010566255B2

(12) United States Patent
Akiba et al.

(10) Patent No.: US 10,566,255 B2
(45) Date of Patent: Feb. 18, 2020

(54) METHOD OF MANUFACTURING SEMICONDUCTOR DEVICE

(71) Applicant: Renesas Electronics Corporation, Koutou-ku, Tokyo (JP)

(72) Inventors: Toshihiko Akiba, Tokyo (JP); Bunji Yasumura, Tokyo (JP); Masanao Sato, Tokyo (JP); Hiromi Abe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/519,150

(22) Filed: Jul. 23, 2019

(65) Prior Publication Data
US 2019/0348332 A1    Nov. 14, 2019

Related U.S. Application Data

(63) Continuation of application No. 16/167,492, filed on Oct. 22, 2018, now abandoned, which is a (Continued)

(30) Foreign Application Priority Data
Mar. 31, 2008  (JP) ................................ 2008-092633

(51) Int. Cl.
*H01L 23/00*     (2006.01)
*H01L 21/66*     (2006.01)
(Continued)

(52) U.S. Cl.
CPC .............. *H01L 22/32* (2013.01); *G01R 31/26* (2013.01); *H01L 22/14* (2013.01); *H01L 22/20* (2013.01);
(Continued)

(58) Field of Classification Search
CPC ..... H01L 22/32; H01L 25/0657; H01L 24/49; H01L 24/13; H01L 24/12; H01L 24/11;
(Continued)

(56) References Cited

U.S. PATENT DOCUMENTS 5,554,940 A    9/1996  Hubacher
6,097,082 A    8/2000  Sato
(Continued)

FOREIGN PATENT DOCUMENTS

JP    61-294838 A    12/1986
JP    11-163055 A     6/1999
(Continued)

OTHER PUBLICATIONS

Office Action dated Jan. 17, 2012, in Japanese Patent Application No. 2008-092633.
(Continued)

*Primary Examiner* — Thinh T Nguyen
(74) *Attorney, Agent, or Firm* — SGPatents PLLC

(57) ABSTRACT

Provided is a semiconductor device having a pad on a semiconductor chip, a first passivation film formed over the semiconductor chip and having an opening portion on the pad of a probe region and a coupling region, a second passivation film formed over the pad and the first passivation film and having an opening portion on the pad of the coupling region, and a rewiring layer formed over the coupling region and the second passivation film and electrically coupled to the pad. The pad of the probe region placed on the periphery side of the semiconductor chip relative to the coupling region has a probe mark and the rewiring layer extends from the coupling region to the center side of the semiconductor chip. The present invention provides a technology capable of achieving size reduction, particularly pitch narrowing, of a semiconductor device.

11 Claims, 30 Drawing Sheets

Related U.S. Application Data continuation of application No. 15/876,833, filed on Jan. 22, 2018, now Pat. No. 10,134,648, which is a continuation of application No. 15/494,501, filed on Apr. 22, 2017, now Pat. No. 9,911,673, which is a continuation of application No. 15/219,254, filed on Jul. 25, 2016, now Pat. No. 9,646,901, which is a continuation of application No. 14/876,787, filed on Oct. 6, 2015, now abandoned, which is a continuation of application No. 14/465,975, filed on Aug. 22, 2014, now Pat. No. 9,165,845, which is a continuation of application No. 13/802,704, filed on Mar. 13, 2013, now Pat. No. 8,912,540, which is a continuation of application No. 13/310,261, filed on Dec. 2, 2011, now Pat. No. 8,415,199, which is a continuation of application No. 12/413,971, filed on Mar. 30, 2009, now Pat. No. 8,101,433.

(51) Int. Cl.
  *G01R 31/26* (2020.01)
  *H01L 25/065* (2006.01)

(52) U.S. Cl.
  CPC .............. *H01L 22/30* (2013.01); *H01L 24/03* (2013.01); *H01L 24/05* (2013.01); *H01L 24/06* (2013.01); *H01L 24/11* (2013.01); *H01L 24/12* (2013.01); *H01L 24/13* (2013.01); *H01L 24/45* (2013.01); *H01L 24/48* (2013.01); *H01L 24/49* (2013.01); *H01L 25/0657* (2013.01); *H05K 999/99* (2013.01); *H01L 24/73* (2013.01); *H01L 2224/02166* (2013.01); *H01L 2224/02313* (2013.01); *H01L 2224/02371* (2013.01); *H01L 2224/02373* (2013.01); *H01L 2224/02381* (2013.01); *H01L 2224/0392* (2013.01); *H01L 2224/0401* (2013.01); *H01L 2224/04042* (2013.01); *H01L 2224/05012* (2013.01); *H01L 2224/05073* (2013.01); *H01L 2224/05082* (2013.01); *H01L 2224/05187* (2013.01); *H01L 2224/05552* (2013.01); *H01L 2224/05553* (2013.01); *H01L 2224/05554* (2013.01); *H01L 2224/05555* (2013.01); *H01L 2224/05558* (2013.01); *H01L 2224/05624* (2013.01); *H01L 2224/05644* (2013.01); *H01L 2224/0603* (2013.01); *H01L 2224/06133* (2013.01); *H01L 2224/06135* (2013.01); *H01L 2224/10* (2013.01); *H01L 2224/1132* (2013.01); *H01L 2224/11334* (2013.01); *H01L 2224/13099* (2013.01); *H01L 2224/13144* (2013.01); *H01L 2224/16225* (2013.01); *H01L 2224/32145* (2013.01); *H01L 2224/32225* (2013.01); *H01L 2224/45124* (2013.01); *H01L 2224/45144* (2013.01); *H01L 2224/4813* (2013.01); *H01L 2224/4847* (2013.01); *H01L 2224/48091* (2013.01); *H01L 2224/48145* (2013.01); *H01L 2224/48227* (2013.01); *H01L 2224/48465* (2013.01); *H01L 2224/48624* (2013.01); *H01L 2224/48644* (2013.01); *H01L 2224/48724* (2013.01); *H01L 2224/48744* (2013.01); *H01L 2224/4911* (2013.01); *H01L 2224/49429* (2013.01); *H01L 2224/49431* (2013.01); *H01L 2224/73204* (2013.01); *H01L 2224/73265* (2013.01); *H01L 2224/85951* (2013.01); *H01L 2225/0651* (2013.01); *H01L 2225/06517* (2013.01); *H01L 2924/01002* (2013.01); *H01L 2924/014* (2013.01); *H01L 2924/01004* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01019* (2013.01); *H01L 2924/01022* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/01083* (2013.01); *H01L 2924/05042* (2013.01); *H01L 2924/10329* (2013.01); *H01L 2924/12041* (2013.01); *H01L 2924/1306* (2013.01); *H01L 2924/15311* (2013.01); *H01L 2924/181* (2013.01); *H01L 2924/19041* (2013.01); *H01L 2924/19043* (2013.01); *H01L 2924/30105* (2013.01)

(58) Field of Classification Search
  CPC ................ H01L 22/30; H01L 22/20; H01L 2224/05554
  USPC .......... 438/15, 108, 618, 638; 257/773, 775, 257/777
  See application file for complete search history.

(56) References Cited

U.S. PATENT DOCUMENTS

| | | | |
|---|---|---|---|
| 6,140,149 | A | 10/2000 | Wark |
| 6,166,556 | A | 12/2000 | Wang et al. |
| 6,329,670 | B1 | 12/2001 | Hu |
| 6,380,555 | B1 | 4/2002 | Hembree et al. |
| 6,426,556 | B1 | 7/2002 | Lin |
| 6,429,532 | B1 | 8/2002 | Han et al. |
| 6,511,901 | B1 | 1/2003 | Lam et al. |
| 6,534,853 | B2 | 3/2003 | Liu et al. |
| 6,812,578 | B2 | 11/2004 | Kim et al. |
| 6,844,631 | B2 | 1/2005 | Yong et al. |
| 7,576,431 | B2 | 8/2009 | Takahashi |
| 7,981,788 | B2 | 7/2011 | Muto et al. |
| 8,395,260 | B2 | 3/2013 | Matsuki et al. |
| 2002/0056901 | A1 | 5/2002 | Ono et al. |
| 2002/0111009 | A1 | 8/2002 | Huang et al. |
| 2002/0180026 | A1* | 12/2002 | Liu et al. ................ H01L 22/34 257/692 |
| 2003/0089868 | A1 | 5/2003 | Ito et al. |
| 2004/0061213 | A1 | 4/2004 | Karnezos |
| 2005/0164486 | A1 | 7/2005 | Lua et al. |

FOREIGN PATENT DOCUMENTS

| | | |
|---|---|---|
| JP | 2000-164623 A | 6/2000 |
| JP | 2003-068738 A | 3/2003 |
| JP | 2003-152014 A | 5/2003 |
| JP | 2005-191213 A | 7/2005 |
| JP | 2005-317685 A | 11/2005 |
| JP | 2007-19415 A | 1/2007 |
| JP | 2007-273676 A | 10/2007 |
| JP | 2007-318014 A | 12/2007 |

OTHER PUBLICATIONS

Office Action dated May 14, 2013, in Japanese Patent Application No. 2012-056972.

Office Action dated Apr. 15, 2014, in Japanese Patent Application No. 2013-130933.

Office Action dated Feb. 23, 2016, in Japanese Patent Application No. 2014-217034.

\* cited by examiner

METHOD OF MANUFACTURING SEMICONDUCTOR DEVICE

CROSS-REFERENCE TO RELATED APPLICATIONS

The disclosure of Japanese Patent Application No. 2008-92633 filed on Mar. 31, 2008 including the specification, drawings and abstract is incorporated herein by reference in its entirety.

BACKGROUND OF THE INVENTION

The present invention relates to a semiconductor device and a manufacturing technology thereof. In particular, the invention pertains to a technology effective when applied to the manufacture of a semiconductor device having a conductive film formed, after a probe test step is performed by bringing a probe needle into contact with a pad, on the pad by plating.

In a probe test step (test step) of a semiconductor device equipped with a semiconductor circuit (for example, LSI), electrical properties are measured by bringing a probe needle (probe) into contact with the surface of a pad formed over a semiconductor wafer. Since this probe needle is made of a hard metal such as W (tungsten) and has a sharp top, it inevitably gives an external damage, as a probe mark, to the surface of a pad made of, for example, Al (aluminum) during the probe test step.

Japanese Patent Laid-Open No. 2007-318014 (Patent Document 1) discloses a technology of carrying out inspection by bringing a probe needle into contact with one of two regions of a pad and forming a bump electrode in the other region having no probe mark.

SUMMARY OF THE INVENTION

FIGS. 1(a), 1(b) and 1(c) are fragmentary cross-sectional schematic views of a semiconductor device during manufacturing steps thereof investigated by the present inventors, in which FIG. 1(a) illustrates the device after formation steps of a semiconductor circuit and a pad are completed; FIG. 1(b) illustrates the device probed in a probe test step; and FIG. 1(c) illustrates the device after a rewiring layer is formed. In FIG. 1, the symbol 1W indicates a semiconductor wafer, 2 indicates a pad, 3 indicates a passivation film, 4 indicates a probe needle, 5 indicates a passivation film, 6 indicates a seed film, 7 indicates rewiring layer, 8 indicates a passivation film, and 9 indicates a bump electrode.

Manufacturing steps of a semiconductor device include a probe test step using the probe needle 4 in order to test the properties of a semiconductor circuit formed over the main surface (element formation surface) of the semiconductor wafer 1W. This probe test step is carried out while bringing the probe needle 4 into contact with a plurality of the pads 2 (FIG. 1(a)) formed over each device formation region (a region which will be a semiconductor chip later, a chip region) (FIG. 1(b)). A probe mark 100 (external damage, recess) caused by the probe needle 4 remains on the surface of the pad 2 of each device formation region which has finished the probe test step. It should be noted that in FIG. 1, a cantilever probe is employed for probing.

In recent years, with a reduction in the size of semiconductor devices, the pitch of pads (pad pitch) of a semiconductor chip tends to be narrow. It is therefore necessary to reduce the size of each pad in order to increase the pin count and thereby fabricate a multifunctional device. When such a pad is subjected to probe test, the probe mark seems to large relative to the pad.

For example, when a wire (which will hereinafter be called "wire" simply) is coupled onto a pad having such a large probe mark, presence of the probe mark reduces a contact area between the wire and the pad, which may lead to a poor coupling problem. Coupling of a wire to a position where the probe mark is absent as described in Patent Document 1 is considered as a measure to solve the problem.

As another measure against the pitch reduction of a semiconductor device, pitch conversion of a pad using rewiring technology is presumed to be effective. Rewiring technology (which is also called "WPP (Wafer Process Package) technology" or "WLP (Wafer Level Package) technology") is a technology in which a typical wafer process (a front-end step) and a packaging process (a back-end step) are integrated. In this technology, after completion of packaging in the form of a semiconductor wafer, the wafer is individualized into each semiconductor chips. In short, a semiconductor chip having a widened pitch is manufactured by forming pads with a narrow pitch by utilizing a miniaturization technology of a wafer process and then forming a rewiring layer electrically coupled to the pad.

The present inventors investigated not a semiconductor device in which a wire is coupled to the pads of a semiconductor chip but a semiconductor device capable of converting the pitch of the pads of the semiconductor chip by utilizing the rewiring technology as described above. The inventors have found the following problems of such a semiconductor device.

By the rewiring technology, a seed film 6 which is a conductive film is formed by sputtering over a pad 2 formed in each device formation region and a rewiring layer 7 (interconnect layer) is formed by plating. Then, the pad 2 is led to a desired position (vacant region) over the main surface of the semiconductor wafer (which will be a semiconductor chip later) in order to couple it to the outside of the semiconductor chip. This means that the rewiring layer 7 is formed by plating so that even if the probe mark 100 is present on the pad 2, the rewiring layer 7 is formed over the pad 2 to block therewith the probe mark 100. Use of this rewiring technology therefore enables coupling between the rewiring layer 7 and the pad 2 even if the large probe mark 100 is formed over the pad 2.

The present inventors however have found another problem as described below. First, the present inventors found that as illustrated in FIG. 1(c), a convex portion 101 like a hump was formed on the surface of the rewiring layer 7. As a result of analysis of this convex portion 101, a pore 102 (gap) appeared at the interface between the surface of the pad 2 and the rewiring layer 7 as illustrated in FIG. 1(c).

This pore 102 is presumed to be formed because the rewiring layer 7 formed by plating seems to block the probe mark 100 therewith, but a plating film (plating layer) grows in the rewiring layer 7 so as to block the upper portion of the probe mark 100 (recess). When a region (including a margin of the region) with which the probe 4 is brought into contact and a region (including a margin of the region) in which the seed film 6 (conductive film) is formed over the pad 2 including the margin are equal, formation of such a pore 102 in a current pathway raises the resistance of the rewiring layer as a interconnect layer and there is a fear of delay in signal transmission.

In addition, breakage of the seed film 6 due to a step difference of the probe mark 102 hampers the subsequent uniform growth of plating. There is therefore a fear of a pore being formed inside of the plating film and this may lead to a decrease in contact area, deterioration in coupling, worsening of surface flatness, deterioration in the coverage with an upper passivation film 8, and short-circuit with an adjacent portion.

An object of the invention is to provide a technology capable of achieving the size reduction of a semiconductor device, particularly, the pitch narrowing of the device.

Another object of the invention is to provide a technology capable of achieving the high pin count of a semiconductor device.

A further object of the invention is to provide a technology capable of achieving improvement in the electrical properties of a semiconductor device operated at a high speed.

A still further object of the invention is to provide a technology capable of achieving improvement in the reliability of a semiconductor device.

The above-described and the other objects and novel features of the invention will be apparent by the description herein and accompanying drawings.

The typical invention of the inventions disclosed herein will next be described briefly.

In one aspect of the invention, there is provided a manufacturing method of a semiconductor device, which includes forming, over a semiconductor wafer, a pad having a probe region and a coupling region, forming a first insulating film from which the probe region and the coupling region are exposed, bringing a probe needle to the pad in the probe region to measure electrical properties, and forming a conductive film covering therewith the first insulating film and the coupling region over the pad.

Advantages available by the typical invention disclosed herein will next be described briefly.

According to the one aspect of the invention, a rewiring layer can be formed using a conductive film free from pores due to a probe mark. This enables to provide a technology capable of achieving the size reduction, particularly pitch narrowing, of a semiconductor device; a technology capable of achieving a high pin count of a semiconductor device; a technology capable of achieving improvement in the reliability of a semiconductor device; and a technology capable of achieving improvement in electrical properties of a semiconductor device operated at a high speed.

BRIEF DESCRIPTION OF THE DRAWINGS

FIGS. 1(a), 1(b) and 1(c) are fragmentary cross-sectional schematic views of a semiconductor device during a manufacturing step thereof investigated by the present inventors, wherein FIG. 1(a) illustrates the device after completion of the formation steps of a semiconductor circuit and a pad; FIG. 1(b) illustrates the device probed in a probe test step; and FIG. 1(c) illustrates the device after formation of a rewiring layer;

FIGS. 18(a), 18(b) and 18(c) are schematic plan views of the coupling state of a wire, wherein FIG. 18(a) illustrates coupling of the wire to a pad via a bump electrode and FIGS. 18(b) and 18(c) each illustrates the direct coupling of the wire to the pad;

FIGS. 25(a), 25(b) and 25(c) are fragmentary cross-sectional schematic views of a semiconductor device according to a fifth embodiment of the invention, wherein FIG. 25(a) illustrates the structure of a rewiring layer and a solder bump electrode; FIG. 25(b) illustrates the structure of a stud bump electrode; and FIG. 25(c) illustrates the structure of a rewiring layer and a pad;

DETAILED DESCRIPTION OF THE PREFERRED EMBODIMENTS

Figure 1A:
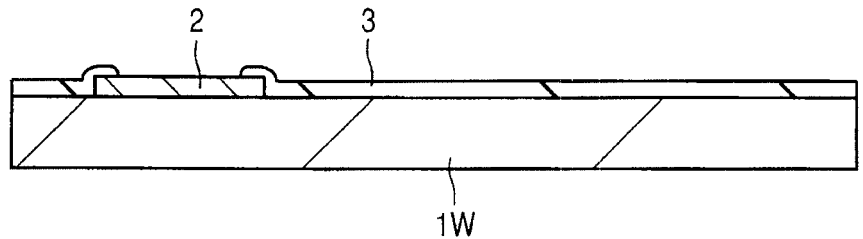

Embodiments of the invention will hereinafter be described specifically based on accompanying drawings. In all the drawings for describing the embodiments, members having a like function will be identified by a like reference numeral and repeating description may be omitted. In the drawings for describing the following embodiments, hatching may be applied even to a plan view in order to facilitate understanding of the configuration.

Embodiment 1

Figure 2:
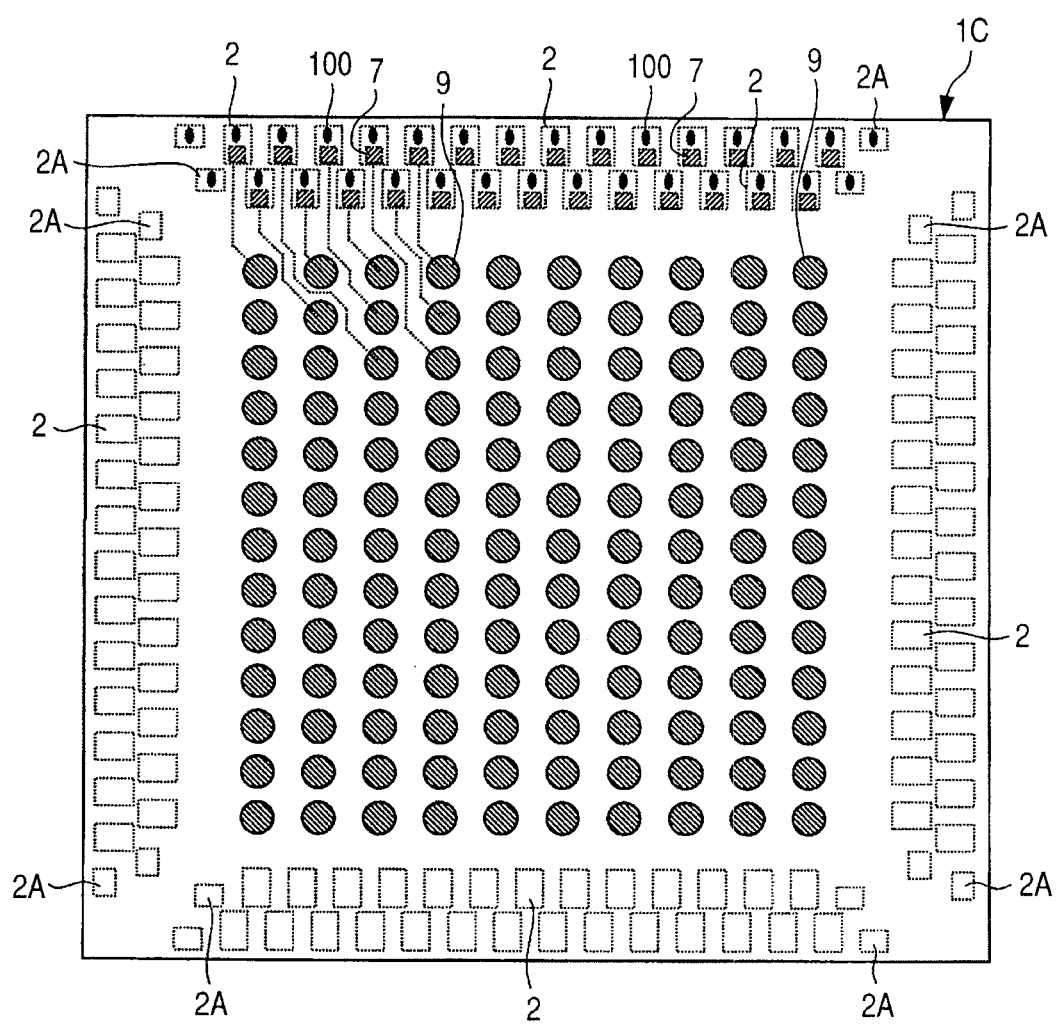
FIG. 2 is a schematic plan view of a semiconductor device according to a first embodiment of the invention.
Figure 3:
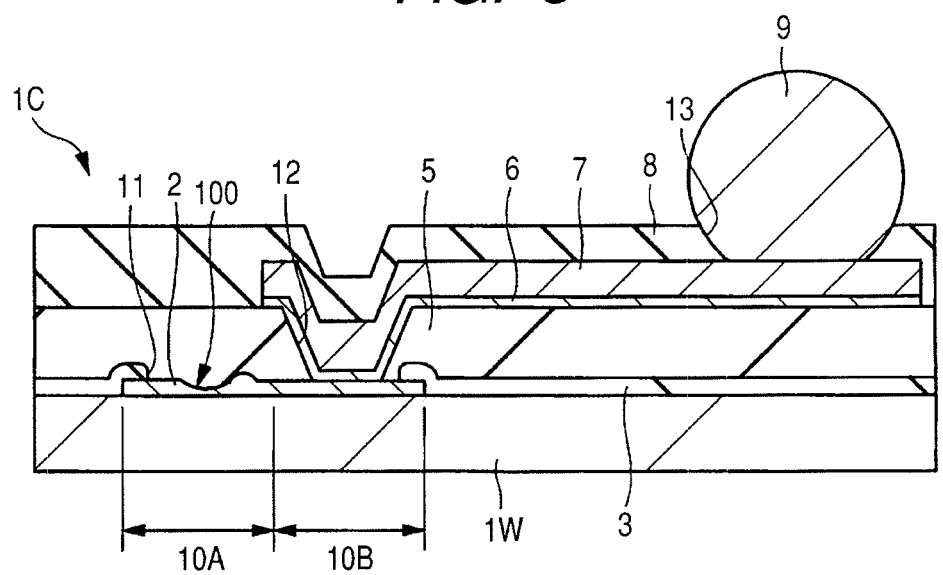
FIG. 3 is a fragmentary cross-sectional schematic view of the semiconductor device illustrated in FIG. 2.
Figure 4:
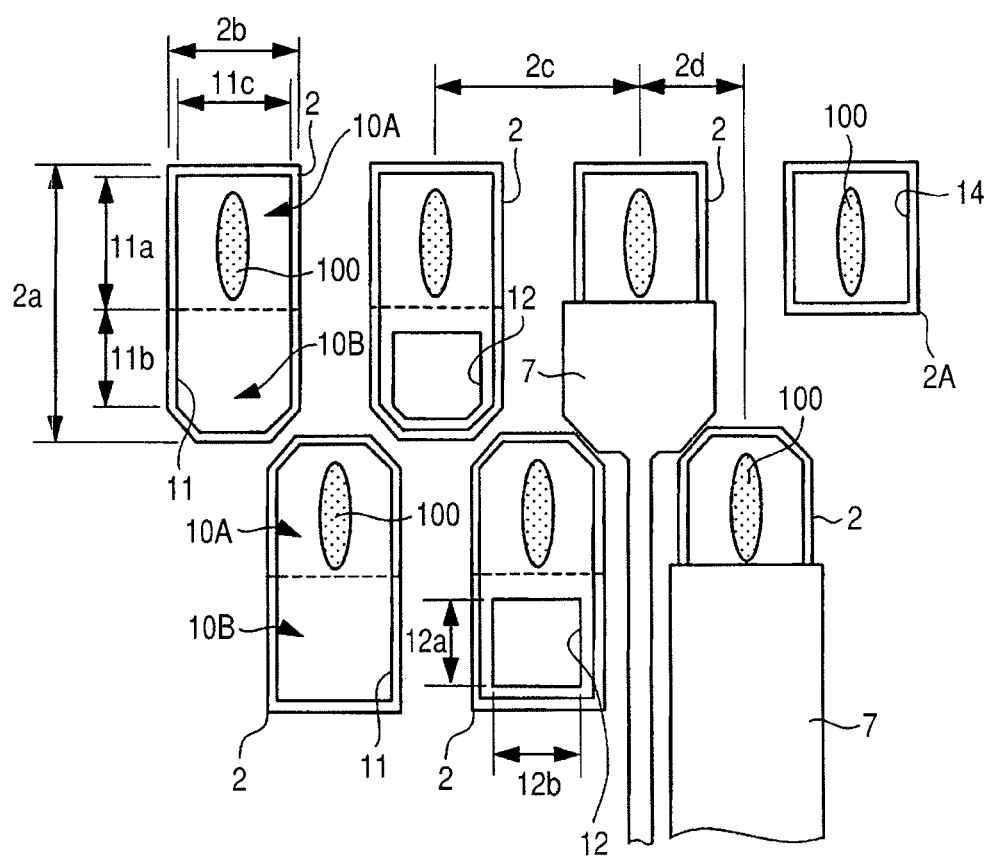
FIG. 4 is a fragmentary schematic plan view of the semiconductor device illustrated in FIG. 2.

First, the configuration of a semiconductor device according to this embodiment will be described referring to some drawings. FIG. 2 is a schematic plan view of the semiconductor device according to this embodiment; FIG. 3 is a fragmentary cross-sectional schematic view of the semiconductor device illustrated in FIG. 2; and FIG. 4 is a fragmentary schematic plan view of the semiconductor device shown in FIG. 2. FIG. 4 however illustrates the device after removal of a portion thereof.

The semiconductor device according to this embodiment is comprised of a semiconductor chip 1C having a BGA (Ball Grid Array) structure. The semiconductor chip 1C has, at the center portion thereof, bump electrodes 9 in the ball form arranged into a matrix. The bump electrodes 9 are each placed as an external electrode of the semiconductor chip 1C so as to protrude from a passivation film 8 which will be a surface protective film. In FIG. 2, pads (electrodes) 2 placed at the periphery of the semiconductor chip 1C and a rewiring layer 7 for electrically coupling the pads 2 and the bump electrodes 9 are covered with this passivation film 8 and they are indicated by dotted lines.

A semiconductor circuit (for example, LSI) which is not illustrated in these diagrams is placed over the main surface (element formation surface) of the semiconductor chip 10 having a rectangular shape. The semiconductor circuit is formed by a known technology by the so-called front-end steps (typical wafer process) and it is comprised of, for example, MISFET (Metal Insulator Semiconductor Field Effect Transistor), resistor, capacitor and interconnects for electrically coupling these elements.

The pads 2 which are electrically coupled to interconnects configuring the semiconductor circuit and placed over the semiconductor chip 10 (semiconductor circuit) are arranged at the periphery of the semiconductor chip 10 having a rectangular shape. Each of these pads 2 has, as illustrated by two regions partitioned by a broken line in FIG. 4, a probe region 10A on the periphery side of the semiconductor chip 10 and a coupling region 10B on the center side thereof.

A passivation film 3 is laid over the semiconductor chip 10 (semiconductor circuit). This passivation film 3 is made of, for example, a silicon nitride film which is an inorganic insulating film and has an opening portion 11 on the probe region 10A and the coupling region 10B of the pad 2. Over the pad 2 and the passivation film 3, a passivation film 5 is formed. This passivation film 5 is made of, for example, a polyimide film which is an organic insulating film and has an opening portion 12 having a square plane shape over the coupling region 10B of the pad 2.

As described above referring to FIG. 1, the probe region 10A of the pad 2 placed on the periphery side of the semiconductor chip 1C relative to the coupling region 10B has a probe mark 100 (external damage, recess) formed by the contact between the probe needle 4 and the pad 2 during a probe test step. The rewiring layer 7 electrically coupled to the pad 2 is, on the other hand, placed over the coupling region 10B and the passivation film 5 via a seed film 6 (conductive film). In short, in the pad (electrode) 2 exposed from the passivation film (insulating film) 3, interconnect layers (the seed film 6 and the rewiring layer 7) which are conductive members are coupled to a region where the probe mark 100 is not formed (the coupling region (second region) 10B which is more flat than the probe region (first region)

10A in which the probe mark is formed). The rewiring layer 7 extends, via the seed film 6 (conductive film), from the coupling region 10B to the center side of the semiconductor chip 1C. On the surface of the pad 2, by placing the coupling region 10B on the center side of the semiconductor chip 1C and leading one end portion of the rewiring layer 7 opposite to the other end portion which is coupled to the pad 2 toward the center side over the main surface of the semiconductor chip 1C, the following advantages can be achieved.

The interconnect layers (seed film 6 and rewiring layer 7) which are conductive members are coupled to a flat region on the surface of the pad 2 where no probe mark 100 is formed so that no probe mark (gap) 100 appears on a current pathway. Such a semiconductor device has therefore improved electrical properties. When the probe region 10A exists between the coupling region 10B and the center of the semiconductor chip 1C (below a pathway where interconnect layers (seed film 6 and rewiring layer 7) are placed), a portion of the interconnect layers are pushed up by the convex portion 101 like a hump formed over the probe region 10A as described above and exposed from the passivation film (insulating film) 8 on the uppermost surface which will be formed later. This may presumably deteriorate the reliability of the resulting semiconductor device. Even if the coupling region 10B is placed on the periphery side of the semiconductor chip 1C, there is no fear of the portion of the interconnect layers (seed film 6 and rewiring layer 7) being exposed from the passivation film 8 insofar as the interconnect layers can be led to the peripheral side of the semiconductor chip 1C from the pad 2. Since the plural pads (electrodes) 2 are placed along each side of the semiconductor chip 1C having a square plane, it is difficult to insert the one end of the interconnect layer between the pad 2 and the periphery of the semiconductor chip 1C. As shown in Embodiment 1, by placing the coupling region 10B near the short side of the pad 2 having a rectangular plane located on the center side on the main surface of the semiconductor chip 1C, exposure of a portion of the interconnect layer from the passivation film 8 can be suppressed so that the semiconductor device can have improved reliability.

The passivation film 8 serving as a protective film on the uppermost surface is formed over the rewiring layer 7 and the passivation film 5. The passivation film 8 has an opening portion 13 over a portion of the rewiring layer 7. The rewiring layer 7 has, over a portion thereof, a bump electrode 9 which is in the ball form and protrudes from the opening portion 13.

The semiconductor chip 1C having such a structure can have the bump electrodes 9 with a pitch widened by the pad 2 for realizing pitch narrowing and the rewiring layer 7 electrically coupled thereto. In other words, the semiconductor device in this embodiment can achieve size reduction, particularly pitch narrowing by electrically coupled, via the pad 2 and the rewiring layer 7, the semiconductor circuit and the bump electrode 9 serving as an external electrode.

In this embodiment, two regions are partitioned on the pad. They are the probe region 10A, that is, a region (including the margin thereof) with which the probe 4 is brought into contact and the coupling region 10B, that is, a region (including the margin thereof) in which the seed film 6 (conductive film) is formed on the pad 2 including the margin. Such a configuraion makes it possible to avoid loss of the rewiring layer 7 and/or the seed film 6 as described above referring to FIG. 1 due to the influence of the probe mark 100 formed during the probe test step and in addition, to suppress exposure of the rewiring layer 7 as shown by the convex portion 101 from the passivation film 8.

In this embodiment, the pad 2 has a rectangular plane with a long side extending from the periphery side to the center side of the semiconductor chip 1C. In the pad 2, the size 2a is set at, for example, 130 µm; the size b is set at, for example, 75 µm; and the pitch 2c is set at 80 µm. By using, as the pad 2, such a pad having a rectangular planar shape, size reduction, particularly, pitch narrowing can be achieved. In this Embodiment, the pads 2 are arranged in a zigzag manner at the periphery of the rectangular semiconductor chip 1C. This enables to achieve narrower pitching. For example, the pitch 2d between the outer pad 2 and the inner pad 2 is set at 40 µm.

Thus, this embodiment is useful for achieving size reduction, particularly narrow pitching of a semiconductor device so that a semiconductor circuit to be disposed on a semiconductor chip 1C can have multiple functions and a high pin count (multiple input/output) necessary for it can be realized.

As well as the method as shown in this embodiment, another method is usable for separating a probe region from a coupling region of conductive members (wire and rewiring layer). However, the more distant these regions are, the more impossible the miniaturization of the semiconductor device. In addition, the polyimide film from which a portion of the pad is exposed is an organic insulating film having a lower hardness than that of a metal so that it is inferior in processing accuracy to a metal material and the opening portion has an inclined side surface when viewed cross-sectionally. When a pad is formed while separating it into two regions, it is necessary to form a larger pad in consideration of the inferior processing accuracy of the polyimide film. Use of such a large pad is not suited for miniaturization of a semiconductor device compared with use of only one rectangular pad as described in this embodiment.

Figure 5:
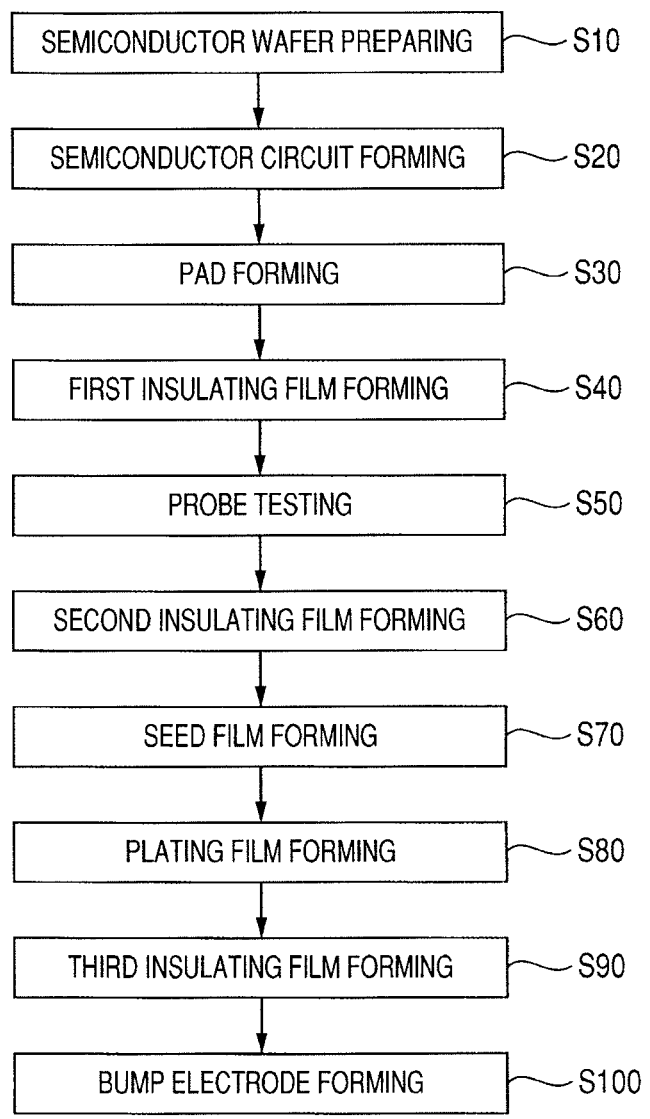
FIG. 5 illustrates a chart of the manufacturing steps of the semiconductor device of the first embodiment of the invention.
Figure 6:
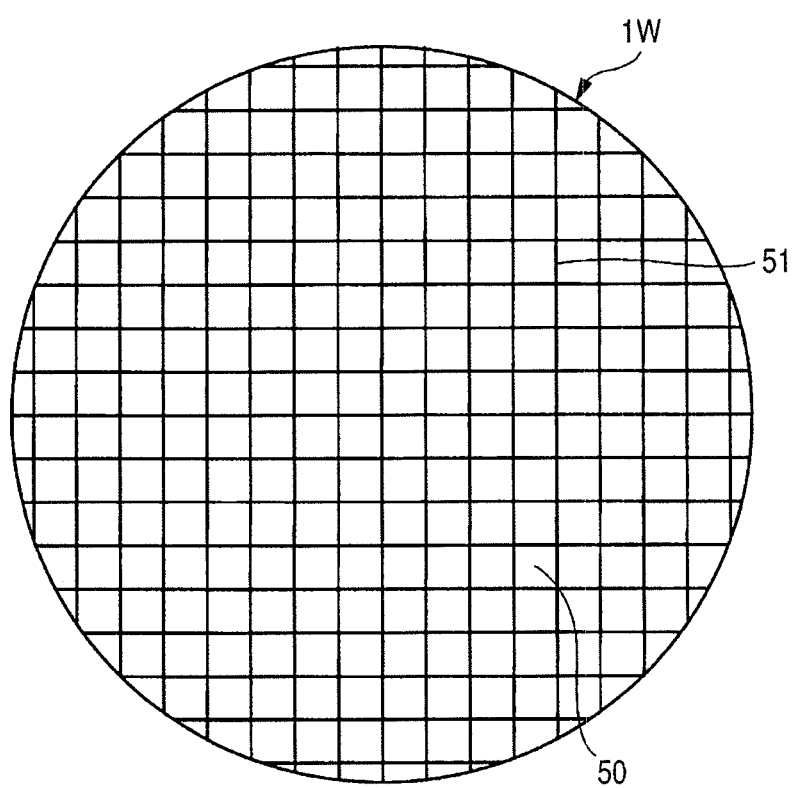
FIG. 6 is a schematic plan view of a semiconductor wafer in the first embodiment of the invention.
Figure 7:
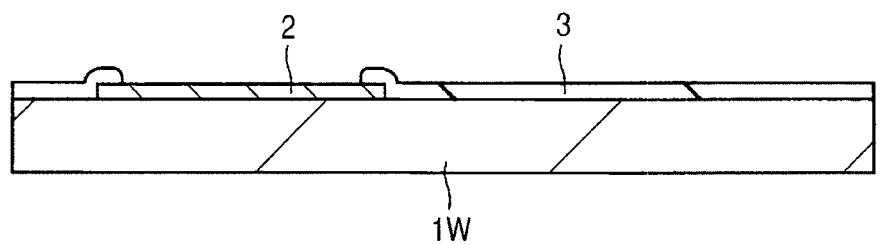
FIG. 7 is a fragmentary cross-sectional schematic view of the semiconductor device during a manufacturing step thereof illustrated in FIG. 5.

A manufacturing method of the semiconductor device according to this embodiment will next be described referring to some drawings. FIG. 5 is a flow chart of manufacturing steps of the semiconductor device of this embodiment; FIG. 6 is a schematic plan view of a semiconductor wafer in this embodiment; and FIGS. 7 to 12 are each a fragmentary cross-sectional schematic view of the semiconductor device during manufacturing steps thereof described in FIG. 5.

A semiconductor wafer 1W as illustrated in FIG. 6 having a device formation region 50 in which a semiconductor circuit is formed is prepared (S10). In this diagram, a scribe region 51 is illustrated. The semiconductor wafer 1W will be cut into individual semiconductor chips 1C along the scribe region 51 in the later step.

Described specifically, prepared is a semiconductor wafer 1W equipped with a plurality of device formation regions 50 (chip regions) having a semiconductor circuit (semiconductor element), a pad (electrode) 2 electrically coupled to the semiconductor circuit, and a passivation film (insulating film) 3 formed on the pad 2 so as to expose a portion of the pad 2. The pad 2 has a probe region (first region) 10A on the periphery side of the device formation region 50 and a coupling region (second region) 10B which is adjacent to the probe region 10A and is on the center side of the chip region relative to the probe region 10A. This semiconductor wafer 1W is, for example, a single crystal Si substrate having a circular planar shape. Each semiconductor chip 1C having a rectangular planar shape (refer to FIG. 2) is diced out from a plurality of the device formation regions of the semiconductor wafer. The semiconductor wafer 1W is not limited to a Si substrate but may be any of compound semiconductor substrates such as GaAs substrate and SiC substrate.

Then, a semiconductor circuit is formed over the main surface of the semiconductor wafer 1W in a known manner (S20). The semiconductor circuit is comprised of, for example, various semiconductor elements such as n channel or p channel MISFET (Metal Insulator Semiconductor Field Effect Transistor), resistor, and capacitor and interconnects (multilayer interconnects) for electrically coupling them.

Then, the pad 2 having the probe region (first region) 10A on the periphery side of the device formation region and the coupling region (second region) 10B which is adjacent to the probe region 10A and is on the center side of the device formation region relative to the probe region 10A is formed over the semiconductor wafer 1W while electrically coupling it to an interconnect configuring the semiconductor circuit (S30). The pad 2 is in a rectangular shape having a long side extending from the periphery side to the center side of the device formation region (which will be the semiconductor chip 1C later) as illustrated in FIG. 2 and FIG. 4. In addition, dummy pads 2A as illustrated in FIG. 4 having a size almost equal to that of the probe region 10A of the pad 2 are formed in alignment. The dummy pads 2A are formed in the row of the probe region 10A of the pad 2 in order to adjust the probing position and they are floating.

The pad 2 has, for example, aluminum (Al) as a main conductive layer. It may have a structure in which the Al film serving as a main conductive layer is sandwiched between barrier conductive films each comprised of a film stack of a Ti film and a TiN film. Such an interconnection can be formed by successively depositing the lower barrier conductive film, the Al film, and the upper barrier conductive film and then dry etching them with a photoresist film patterned by photolithography as a mask.

Then, a passivation film 3 (first insulating film) is formed over the semiconductor wafer 1W (S40). This passivation film 3 is made of, for example, a film stack of a silicon oxide film and a silicon nitride film which are inorganic insulating films and the film stack can be formed, for example, by plasma CVD (Chemical Vapor Deposition). With a photoresist film (not illustrated) patterned by photolithography as a mask, the passivation film 3 is dry-etched to expose therefrom the probe region 10A and the coupling region 10B of the pad 2. By this exposure, the passivation film 3 has an opening portion 11. Of the opening portion 11, an exposure region of the probe region 10A is, for example, 60 μm (size 11a)×70 μm (size 11c) and an exposure region of the coupling region 10B is, for example, 60 μm (size 11b)×70 μm (size 11c). In addition, an opening portion 14 is formed on the dummy pad 2A as illustrated in FIG. 4. It has a similar size to that of the probe region 10A of the opening portion 11.

Figure 8:
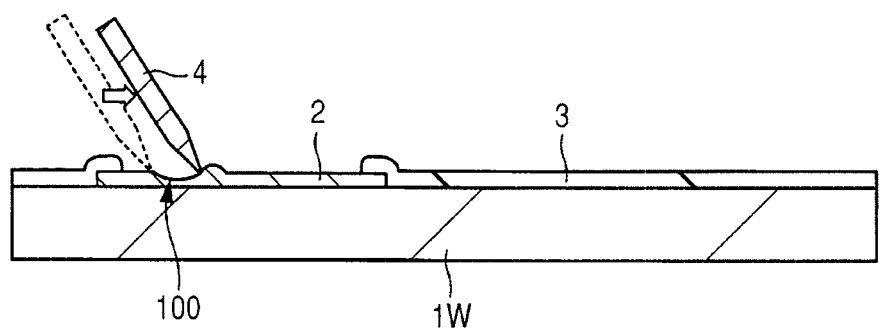
FIG. 8 is a fragmentary cross-sectional schematic view of the semiconductor device during a manufacturing step thereof following that of FIG. 7.

Then, a probe test of the semiconductor circuit is performed (S50). For example, as illustrated in FIG. 8, a cantilever type probe needle 4 is brought into contact with the pad 2 of the probe region 10A to measure various electrical properties. At this time, a probe mark 100 (external damage) by the probe needle 4 remains on the surface of the pad 2. The probe needle 4 is made of a hard metal such as W (tungsten) and has a sharp top so that it inevitably gives damage as the probe mark 100 on the surface of the pad 2 having an Al film as a main conductive layer.

In this embodiment, the pad 2 has a rectangular planar shape and it has the probe region 10A on the periphery side of the semiconductor chip 1C and the coupling region 10B on the center side of the semiconductor chip 1C. The probe needle 4 is brought into contact with only the probe region 10A. The probe mark 100 is therefore present only on the pad 2 of the probe region 10A.

In this embodiment, dummy pads 2A having a similar size to that of the probe region 10A of the pad 2 and arranged in alignment are formed simultaneously with the formation of the pad 2 (refer to FIG. 4). The probe test is performed with this dummy pad 2A as a target so that shift of the probe needle 4 from the probe region 10A to the coupling region 10B can be prevented. In short, the probe mark 100 is always present on the pad 2 of the probe region 10A.

The probe test includes not only tests at operation guarantee temperatures (for example, from −40 to 125° C.) at normal temperature, high temperature, and low temperature but also tests for each function because semiconductor devices have multiple functions. In a plurality of testing apparatuses (testers), the probe needle 4 is inevitably brought into contact with the same pad 2 a plurality of times. In addition, the probe test also includes a so-called wafer level burn in so that a voltage is applied to a semiconductor circuit by bringing the probe needle 4 into contact with the pad 2 of the probe region 10A for long hours (for example, several hours) under a high-temperature environment (high-temperature baking) at a temperature around the melting point of a solder (200° C. or greater). This may enlarge the probe mark 100. Even in this case, however, it is possible to limit the presence of the probe mark 100 to the pad 2 of the probe region 10A in this Embodiment.

The probe test may be performed after formation of the bump electrode 9, but in this case it is impossible to carry out a test similar to the probe test on the pad 2 because of a change in the surface condition (oxidation) of a solder due to a temperature history or limitation of the high-temperature baking temperature due to the influence of the melting point of the solder.

Figure 9:
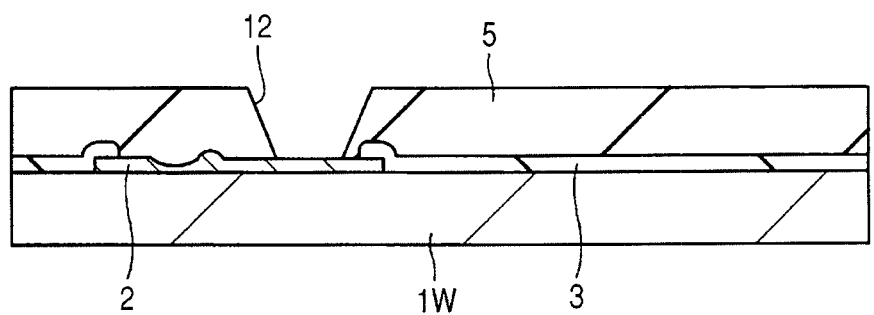
FIG. 9 is a fragmentary cross-sectional schematic view of the semiconductor device during a manufacturing step thereof following that of FIG. 8.

Then, a passivation film 5 (second insulating film) is formed over the semiconductor wafer 1W (S60). This passivation film 5 is made of, for example, a polyimide film which is an organic insulating film and can be formed, for example, by spin coating. Then, as illustrated in FIG. 9, with a photoresist film (not illustrated) patterned by photolithography as a mask, the passivation film 5 is wet-etched to expose therefrom the coupling region 10B of the pad 2. By this exposure, the passivation film 5 has an opening portion 12. Of the opening portion 12, an exposure region of the coupling region 10B has a square planar shape and is, for example, 45 μm (size 12a)×45 μm (size 12b).

Figure 10:
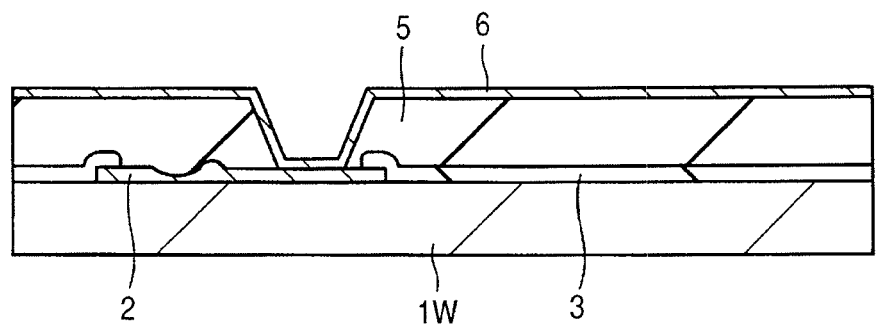
FIG. 10 is a fragmentary cross-sectional schematic view of the semiconductor device during a manufacturing step thereof following that of FIG. 9.

Then, as illustrated in FIG. 10, a seed film 6 (interconnect layer, conductive film, plating layer) electrically coupled to the pad 2 is formed over the coupling region 10b and the passivation film 5 (S70). The seed film 6 serves as a seed film for a conductive film, which will be formed in later by plating, and it is made of, for example, a Pd film by electroless plating. The seed film 6 may be composed of a Pd/Ti film, a Ti film, or a TiN film deposited by sputtering. These films are also conductive films having a barrier property against Cu diffusion.

Figure 11:
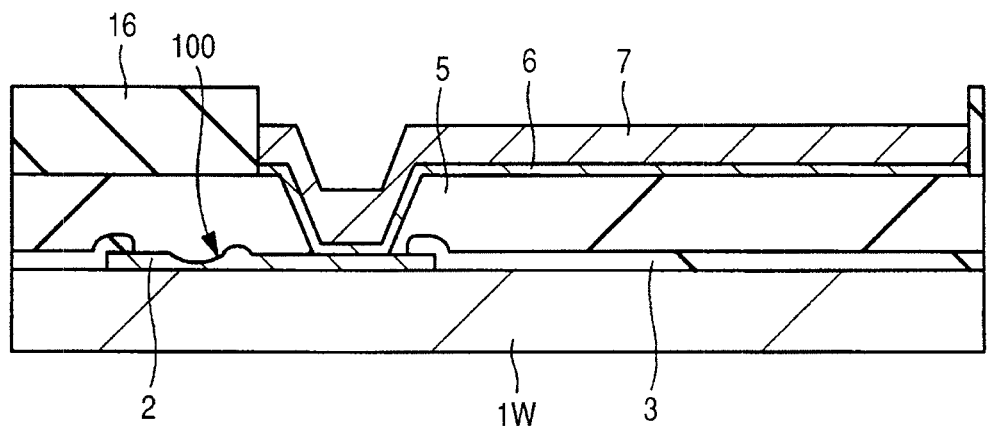
FIG. 11 is a fragmentary cross-sectional schematic view of the semiconductor device during a manufacturing step thereof following that of FIG. 10.

Then, as illustrated in FIG. 11, after formation of a resist film over the semiconductor wafer 1W by the method of application, the resist film is patterned by photolithography into a mask 16 having an opening portion 15 for the formation of a rewiring layer. From the opening portion, a portion of the seed film 6 is exposed.

A rewiring layer 7 made of a conductive film (interconnect layer, plating film) is formed over the seed film 6 by electroplating (S80). More specifically, the rewiring layer 7 is formed over the coupling region 10B and the passivation film 5 so as to extend and hug from the coupling region 10B to the center side of the semiconductor chip 1C while electrically coupling to the pad 2. The rewiring layer 7 is made of a Cu film or a Ni/Cu film. Then, the mask 16 made of the resist film is removed by asking. With the rewiring layer 7 as a mask, the seed film 6 is wet etched to leave a portion of the seed film 6 below the rewiring layer 7 and remove the other portion of the seed film 6 below the mask 16.

Figure 12:
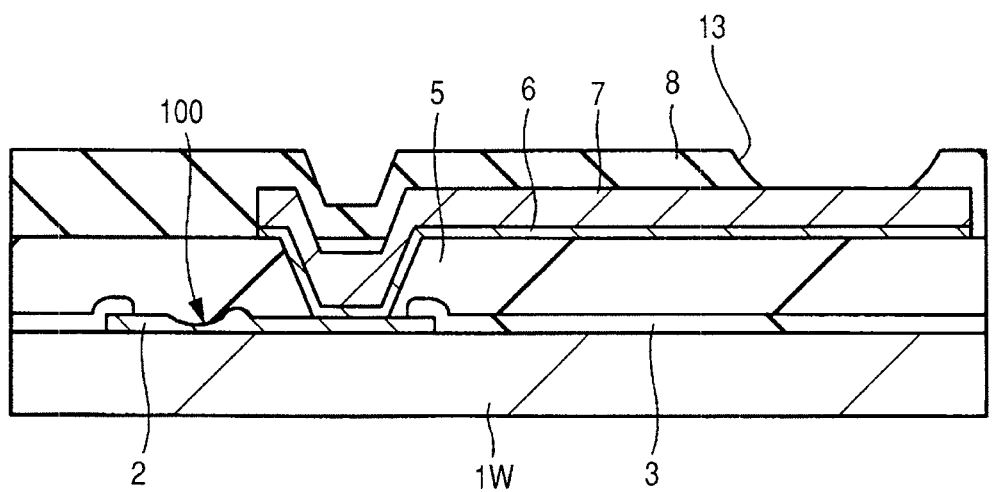
FIG. 12 is a fragmentary cross-sectional schematic view of the semiconductor device during a manufacturing step thereof following that of FIG. 11.

As illustrated in FIG. 12, a passivation film 8 (third insulating film) is formed over the semiconductor wafer 1W (S90). This passivation film 8 is made of, for example, a polyimide film which is an organic insulating film and can be formed, for example, by spin coating. In this embodiment, this passivation film 8 is a protective film of the uppermost surface. To achieve good coverage, it is thicker than the passivation film 5. Then, with a photoresist film (not illustrated) patterned by photolithography as a mask, wet etching of the passivation film 8 is performed to expose therefrom a portion of the rewiring layer 7. By this exposure, the passivation film 8 has an opening portion 13. When a photosensitive polyimide is used as a material of the passivation film 8, the opening portion 13 is formed by photo processing. Employment of the photo processing technology enables microfabrication of the opening portion 13 compared with that formed by wet etching.

Then, an Au film which is not illustrated is formed on the rewiring layer 7 exposed from the opening portion 13 by electroless plating at one end portion of the conductive film (interconnect layer, plating film) on the side opposite to the other end portion of the conductive film coupled to the coupling region (second region) 10B of the pad 2 as illustrated in FIG. 3. After printing a solder paste over the semiconductor wafer 1W by solder printing technology, the solder paste is melted and recrystallized by reflow treatment and a bump electrode (conductive member, solder ball) 9 which serves as an external terminal is formed on the Au film (S100). As the solder paste, Pb (lead) free solder made of, for example, Sn (tin), Ag (silver) and Cu can be used. The bump electrode 9 can also be formed by supplying a solder ball which has been formed in advance onto the opening portion 13 instead of using the solder paste and then subjecting the semiconductor wafer 1W to reflow treatment. The reflow treatment of the solder paste prevents the Au film from diffusing to the bump electrode 9.

Figure 13:
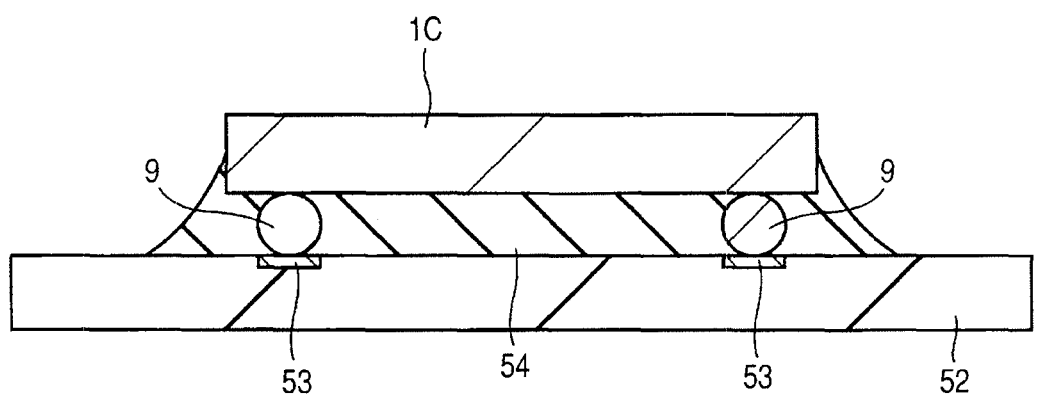
FIG. 13 is a schematic view illustrating the semiconductor device of the first embodiment of the invention mounted onto a mounting substrate.

Then, the semiconductor wafer 1W is cut along the scribe (dicing) region between the device formation regions (between the chip regions adjacent to each other) and separated into individual semiconductor chips 1C as illustrated in FIG. 2, whereby the semiconductor device of this embodiment is completed. For example, as illustrated in FIG. 13, the semiconductor chip 1C can be mounted on a substrate 52 via the bump electrode 9. Described specifically, various semiconductor devices can be formed by placing the semiconductor chip 1C on the substrate 52, reflowing the bump electrode 9 on an electrode 53 thereof, and filling an underfill resin 54 between the semiconductor chip 1C and the substrate 52.

The pitch and size of the pads at the coupling portion are reduced in order to achieve multifunction (increase in the number of pins) and microfabrication (downsizing of chip). The pad size can be reduced, for example, by controlling the probing accuracy and size of a probe mark.

By the technical innovation, the pad pitch (size) is reduced, but it is difficult to drastically reduce the size of a probe mark judging from the contact property in the probe test step or influence of electrical resistance of probing As the probing system, a cantilever system as shown in the present embodiment is being replaced by a vertically movable system. Further technical development of a probing system is however necessary judging from the cost and contact property.

Figure 1B:
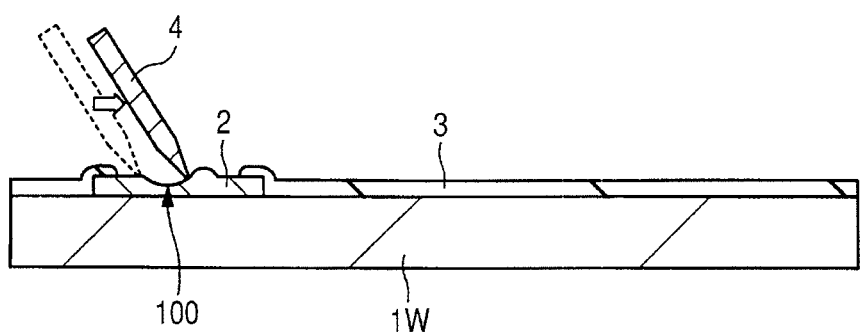
Figure 1C:
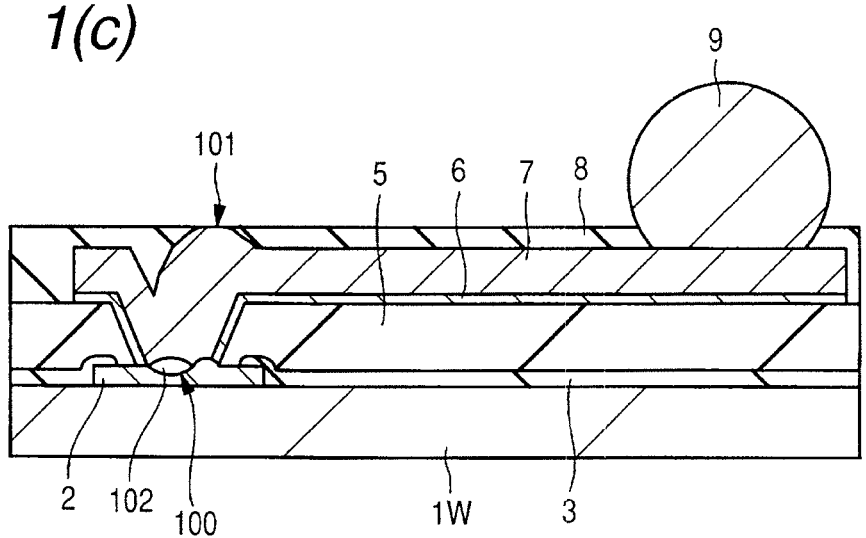

As illustrated in FIG. 1(c), when the pad 2 and the rewiring layer 7 are brought into contact on the probe mark 100, a pore 102 is inevitably formed inside due to insufficient formation of a plating film. This pore 102 deteriorates electrical properties after fabrication and the formation of unevenness by plating may cause inconveniences such as short-circuit with an adjacent pad or exposure of the rewiring layer 8 from the surface (convex portion 101).

In this embodiment, by partitioning the probing region 10A to be probed from the coupling region 10B where the pad and the rewiring layer 7 are coupled and providing a sufficient space for these regions, limitation to probing properties is relaxed. In addition, with a view to controlling the probing position, dummy pads 2A are arranged in the same line with the probe region 10A of the pad 2. This enables to use the cantilever system probing so that the contact property can be ensured without limiting the probe test system. The performances of products including analog characteristics, requirement for which will be severer in future, can be satisfied fully.

Embodiment 2

In the above embodiment, the rewiring layer is comprised of a conductive film (plating film) formed by plating. In this embodiment, on the other hand, a bump electrode is made of a plating film. Embodiment 2 is similar to Embodiment 1 except for the above-described difference.

Figure 14:
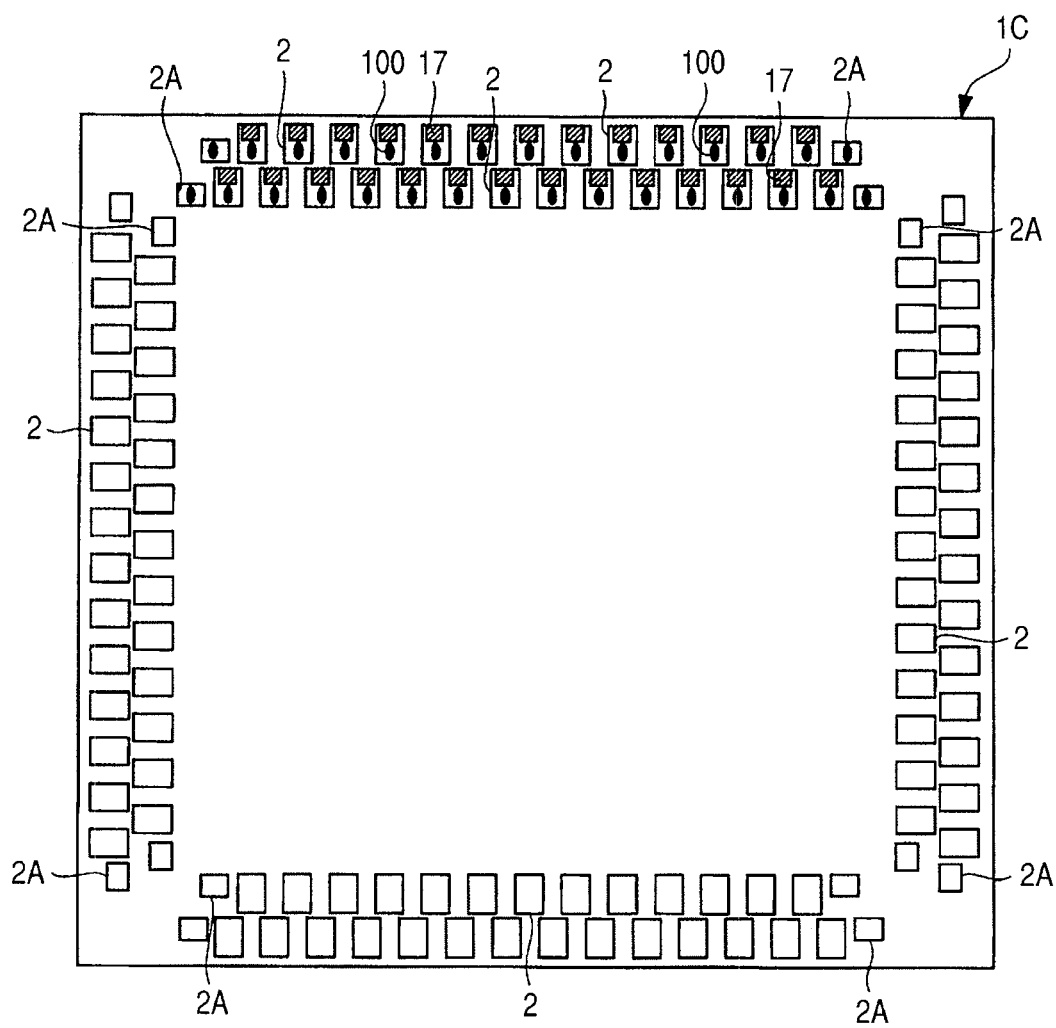
FIG. 14 is a schematic plan view of a semiconductor device according to a second embodiment.
Figure 15:
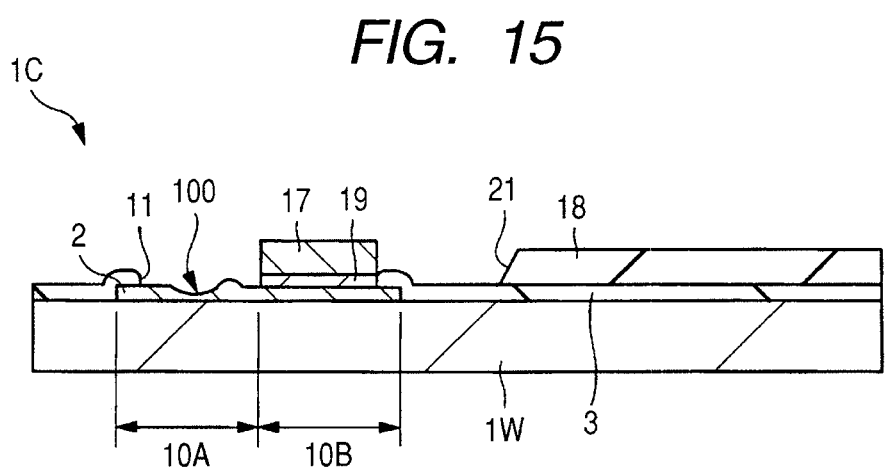
FIG. 15 is a fragmentary cross-sectional schematic view of the semiconductor device illustrated in FIG. 14.
Figure 16:
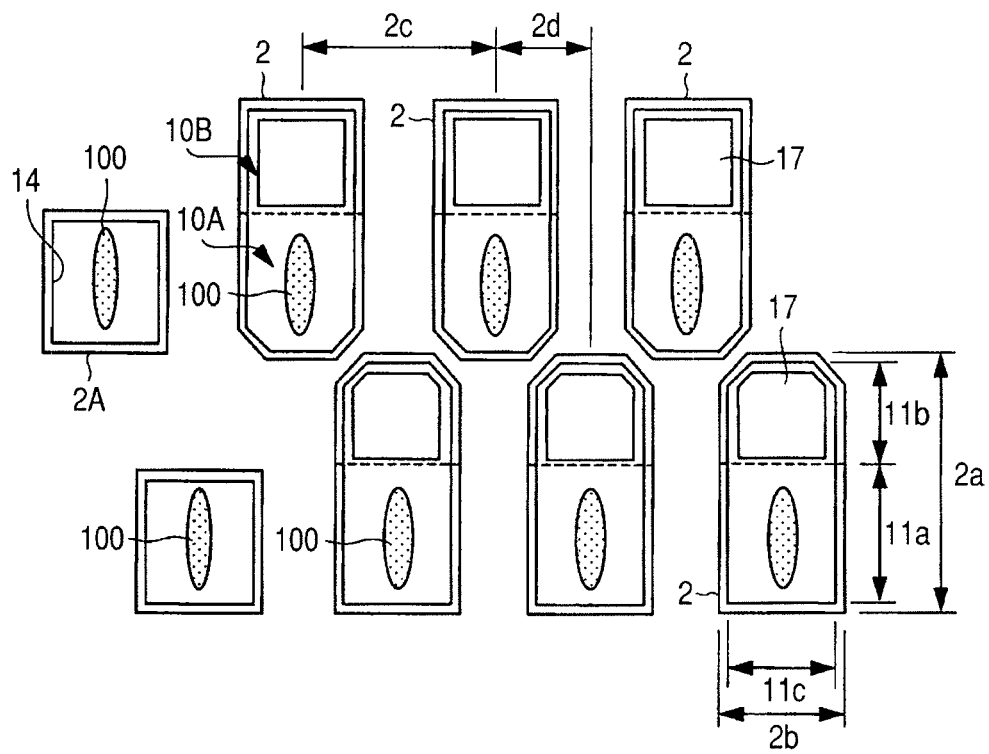
FIG. 16 is a fragmentary schematic plan view of the semiconductor device illustrated in FIG. 14.

The configuration of the semiconductor device according to this embodiment will be described first referring to some drawings. FIG. 14 is a schematic plan view of the semiconductor device according to this embodiment; FIG. 15 is a fragmentary cross-sectional schematic view of the semiconductor device illustrated in FIG. 14; and FIG. 16 is a fragmentary schematic plan view of the semiconductor device illustrated in FIG. 14.

A rectangular semiconductor chip 1C configuring the semiconductor device of this embodiment has, on the main surface thereof, a semiconductor circuit (for example, LSI) not illustrated. A pad 2 electrically coupled to an interconnect configuring the semiconductor circuit and placed on the semiconductor chip 1C (semiconductor circuit) is placed at the periphery of the rectangular semiconductor chip 1C and this pad 2 has, thereover, a bump electrode 17. As shown in FIG. 16 by two regions partitioned by a broken line, the pad 2 has a coupling region 10B on the periphery side of the semiconductor chip 1C and a probe region 10A on the center side. By placing the coupling region 10B on the periphery side of the semiconductor chip 1C, a wire (conductive member) can be extended easily outside the semiconductor chip 1C from the bump electrode 17 formed over the coupling region 10B.

This means that it becomes possible to decrease the length of each of a plurality of wires 57 (conductive members) for electrically coupling a plurality of electrodes 56 (bonding leads) formed on the main surface (upper surface) of a substrate 55 (wiring substrate) and a plurality of pads 2 formed over the main surface (surface) of the semiconductor chip 1C mounted on the main surface (upper surface) of the substrate 55. This leads to improvement in the electrical properties of a semiconductor device.

In this Embodiment, the coupling region 10B of the wire 57 is placed on the circumferential side of the semiconductor chip 1C on the surface of the pad 2 relative to the probe region 10A. The position of the coupling region 10B is not limited to the above-described one, but may be disposed on the center side of the semiconductor chip 1C relative to the probe region 10A and one end portion (ball 20) of the wire 57 may be coupled to it via a bump electrode 17. In consideration of the distance to the electrode 56 (bonding lead) formed on the main surface of the substrate 55 (wiring substrate), the coupling region 10B and the bump electrode 17 are preferably placed on the circumferential side because the length of the wire 57 can be decreased.

A passivation film 3 is formed on the semiconductor chip 1C (semiconductor circuit). This passivation film 3 is made of, for example, a silicon nitride film which is an inorganic insulating film and has an opening portion 11 on the pad 2 in the probe region 10A and the coupling region 10B. A passivation film 18 is formed on the pad 2 and the passivation film 3. This passivation film 18 is made of, for example, a polyimide film which is an organic insulating film and it has an opening portion 21 on the pad 2 in the coupling region 10B.

On the pad 2 in the probe region 10A placed on the center side of the semiconductor chip 10 relative to the coupling region 10B, there is a probe mark 100 (external damage) caused by the contact of a probe needle 4 with the pad 2 in the probe test step as described referring to FIG. 1. On the other hand, the bump electrode 17 is placed, via a seed film 19 (conductive film), on the coupling region 10B and the passivation film 3 while being electrically coupled to the pad 2. In this embodiment, the bump electrode 17 has a rectangular planar shape (refer to FIG. 16), but it may have a polygonal or a circular planar shape. The planar shape is not limited insofar as it enables wire bonding from the bump electrode 17.

In this embodiment, the plane shape of the pad 2 is a rectangular shape having a long side extending from the periphery side to the center side of the semiconductor chip 10. For example, the size 2a of the pad 2 is set at 130 μm, and the size 2b is set at 75 μm. The pitch 2c of the pad 2 is set at 80 μm. By using the pad having a rectangular planar shape, size reduction, particularly narrow pitching of a semiconductor device can be achieved. In this embodiment, the pads 2 are arranged in a zigzag manner at the periphery of the rectangular semiconductor chip 1C. This is useful for achieving narrow pitching. For example, the pitch 2d between the outer pad 2 and the inner pad 2 is set at 40 μm.

Figure 17:
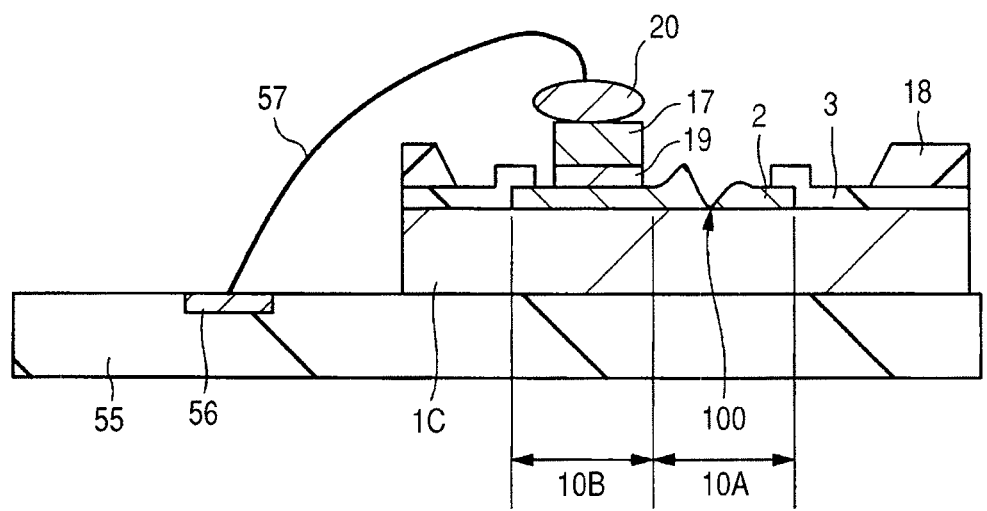
FIG. 17 is a fragmentary cross-sectional schematic view of the semiconductor device illustrated in FIG. 14 in which a plurality of pads of the semiconductor chip 1C and a plurality of the electrodes of a substrate on which the semiconductor chip is mounted are electrically coupled via a plurality of wires bonded to the bump electrode, respectively.
Figure 18A:
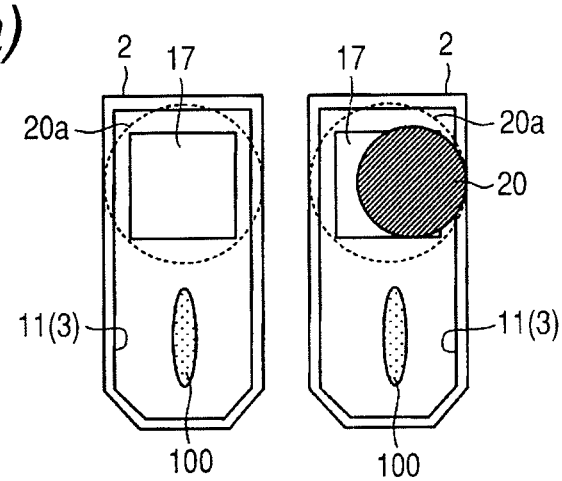
Figure 18B:
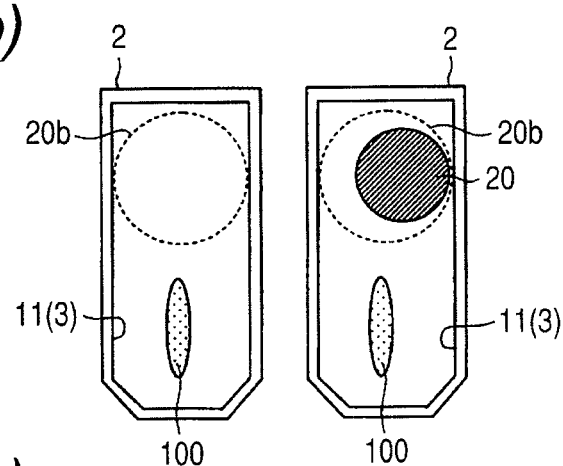
Figure 18C:
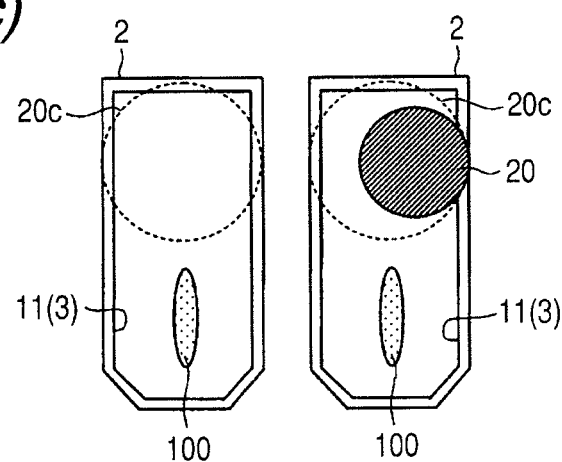

Electrical coupling of the wire 57, which is a conductive member, to the semiconductor chip 1C in this embodiment will next be described referring to some drawings. FIG. 17 is a fragmentary cross-sectional schematic view of the semiconductor device illustrated in FIG. 14 in which a plurality of pads 2 of the semiconductor chip 1C and a plurality of the electrodes 56 (bonding leads) of the substrate 55 (wiring substrate) on which the semiconductor chip 1C is mounted are electrically coupled via a plurality of wires bonded to the bump electrode 17, respectively. FIGS. 18(a), 18(b), and 18(c) are schematic plan views of the coupling state of the ball 20 of the wire 57, in which FIG. 18(a) illustrates the ball coupled to the pad 2 via the bump electrode 17, while FIGS. 18(b) and 18(c) each illustrates the direct coupling of the ball to the pad 2. In each of FIGS. 18(a), 18(h) and 18(c), the pad before wire bonding is illustrated on the left side, while the pad after the wire bonding is illustrated on the right side.

In this Embodiment, the pad 2 has a rectangular shape so as to realize narrow pitching. As illustrated in FIGS. 18(a) and 18(c), regions 20a and 20C (shown by a broken line) including the misalignment of the wire bonding extend to each opening portion 11, that is, the passivation film 3.

In FIG. 18(c), when the ball 20 is electrically coupled to the pad 2 in the region 20c including the misalignment of wire bonding, the ball 20 runs on the passivation film 3 and becomes a cause of crack of the passivation film 3 around the ball 2. This occurs because of a step difference between the surface (upper surface) of the passivation film 3 and the surface (upper surface) of the pad 2 in the opening portion 11 of the passivation film 3. When one end portion of the wire is coupled to the pad 2, the wire runs on the passivation film 3 due to the misalignment. If a load is applied under such a condition, cracks appear in one portion of the passivation film 3.

As illustrated in FIG. 18(b), it is therefore possible to prevent the ball 20 from running on the passivation film 3 by reducing the diameter of the ball 20, thereby decreasing the area of the region 20b including the misalignment of the wire bonding. A reduction in the coupling area of the ball 20 may lead to deterioration in the strength.

In this embodiment, as illustrated in FIG. 18(a) and FIG. 17, the bump electrode 17 is formed on the pad 2. Even if the center of the one end portion of the wire is off from the center of the bump electrode 17 when the one end portion of the wire is coupled onto the bump electrode 17, the one end portion of the wire can be coupled without causing deformation because the bump electrode 17 has a flat surface (upper surface, wire coupling surface). Even if a load is applied under such a condition, the back side (lower surface, a surface to be coupled to the pad 2) of the bump electrode 17 opposite to the surface is coupled only to the coupling region 10B which is a flat region on the pad 2 so that during wire coupling, no load is applied to a portion (opening portion 11) of the passivation film 3 from which the pad 2 is exposed and cracks of the passivation film 3 can be prevented.

Next, a manufacturing method of the semiconductor device of this embodiment will be described referring to some drawings.

FIGS. 19 to 22 are fragmentary cross-sectional schematic views of a semiconductor device during manufacturing steps thereof according to this embodiment. The step described with reference to FIG. 19 follows the step described in Embodiment 1 with reference to FIG. 7 so that the description of it is omitted.

Figure 19:
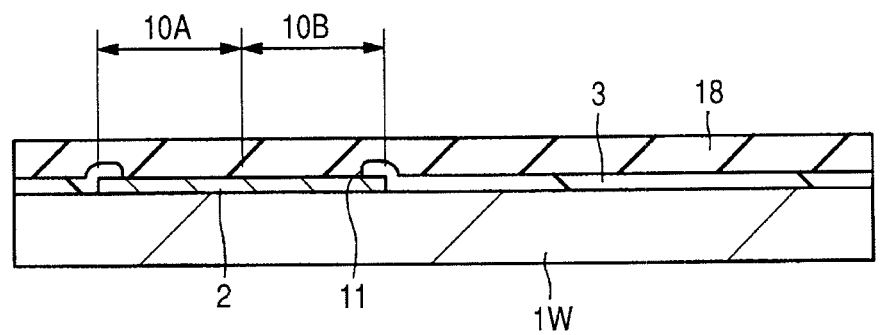
FIG. 19 is a fragmentary cross-sectional schematic view of a semiconductor device during a manufacturing step thereof according to a third embodiment of the invention.

As illustrated in FIG. 19, a passivation film 18 is formed over the semiconductor wafer 1W. This passivation film 18 is made of, for example, a polyimide film which is an organic insulating film and can be formed, for example, by spin coating. Then, with a photoresist film (not illustrated) patterned by photolithography as a mask, wet etching is performed to expose the passivation film 3 around the pad 2 from the passivation film 18 (refer to FIG. 20). By this exposure, the passivation film 18 has an opening portion 21. In the present embodiment, the pad (electrode) 2 is made of, for example, an Al film. When a photosensitive polyimide is used as a material of the passivation film 8, the opening portion 13 is formed by photo processing. Use of the photo processing technology enables microfabrication of the opening portion 13.

Figure 20:
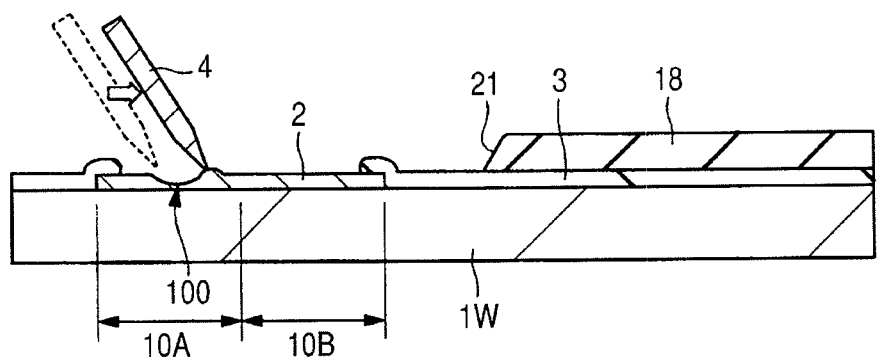
FIG. 20 is a fragmentary cross-sectional schematic view of the semiconductor device during a manufacturing step thereof following that of FIG. 19.

Then, a probe test of the semiconductor circuit is performed. For example, as illustrated in FIG. 20, a cantilever system probe needle 4 is brought into contact with the pad 2 of the probe region 10A to measure various electrical properties. At this time, a probe mark 100 (external damage) due to the probe needle 4 remains on the surface of the pad 2.

Figure 21:
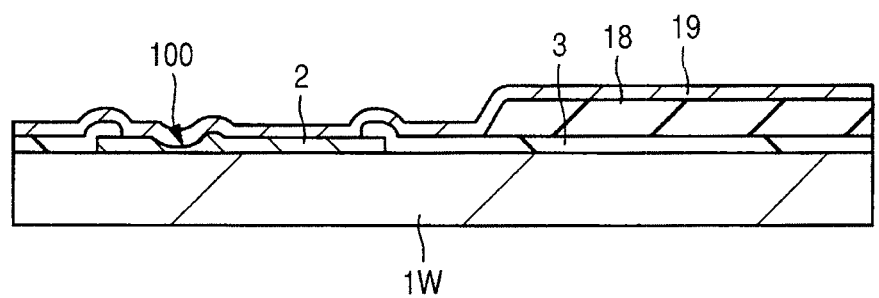
FIG. 21 is a fragmentary cross-sectional schematic view of the semiconductor device during a manufacturing step thereof following that of FIG. 20.

Then, as illustrated in FIG. 21, a seed film 19 is formed over the semiconductor wafer 1W while electrically coupling it to the pad 2. The seed film 19 is a seed film for a conductive film formed later by plating and is made of a Cu film deposited by sputtering.

Figure 22:
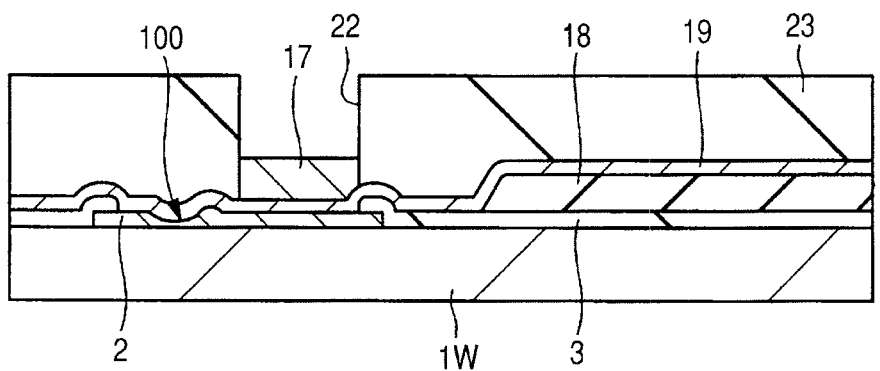
FIG. 22 is a fragmentary cross-sectional schematic view of the semiconductor device during a manufacturing step thereof following that of FIG. 21.

Then, as illustrated in FIG. 22, after a resist film is formed over the semiconductor wafer 1W by the method of application, the resist film is patterned by photolithography to form a mask 23 having a rewiring layer-forming opening portion 22 from which a portion of the seed film 19 is exposed. Then, a bump electrode 17 made of a conductive film (a plating film) is formed on the seed film 19 by electroplating. Described specifically, the bump electrode 17 is electrically coupled to the pad 2 on the coupling region 10B. The bump electrode 17 is made of, for example, an Au film. Use of Au as a material of the bump electrode 17 enables to improve the bondability to the wire made of an Au. Direct coupling of a wire made of Au to the pad 2 made of Al may cause diffusion of Au in Al, contaminate the bonded surface (bonded region) with the wire on the pad 2 made of Al, and deteriorate the bonding strength of the wire. In this embodiment, however, deterioration in the bonding strength of a wire can be suppressed because a Pd film is formed on a Ni film as the seed film (interconnect layer, conductive film, plating layer) 19 on the surface of the pad 2 made of Al and the bump electrode 17 made of Au is formed on this seed film.

Then the mask 23 made of a resist film is removed by asking and with the bump electrode 17 as a mask, the seed film 19 is wet etched to leave a portion of the seed film 19 below the bump electrode 17 but remove the other portion of the seed film 19 below the mask 23 (refer to FIG. 15).

The semiconductor wafer 1W is then cut along the scribe region (dicing) between the device formation regions into individual semiconductor chips 1C as illustrated in FIG. 14, whereby a semiconductor device according to this embodiment is completed. By using the semiconductor device according to this embodiment, various semiconductor devices can be formed by wire bonding and electrically coupling an external terminal and the bump electrode 17 and sealing the semiconductor chip 1C with a resin.

Embodiment 3

In Embodiment 1, the bump electrode is formed on a portion of the rewiring layer by using solder printing technology. In the present embodiment, on the other hand, a pad is formed on a portion of a rewiring layer by using plating. Embodiment 3 is similar to Embodiment 1 except for the above-described difference.

Figure 23:
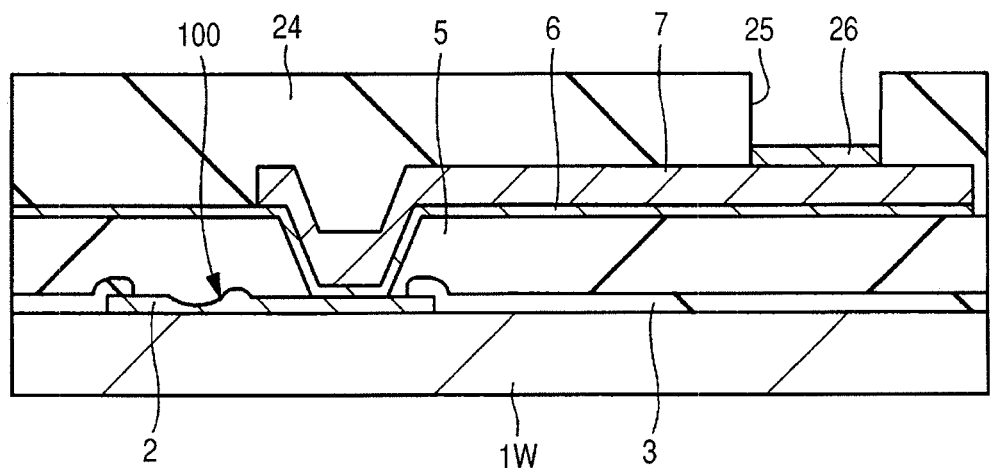
FIG. 23 is a fragmentary cross-sectional schematic view of a semiconductor device during a manufacturing step thereof according to a fourth embodiment of the invention.
Figure 24:
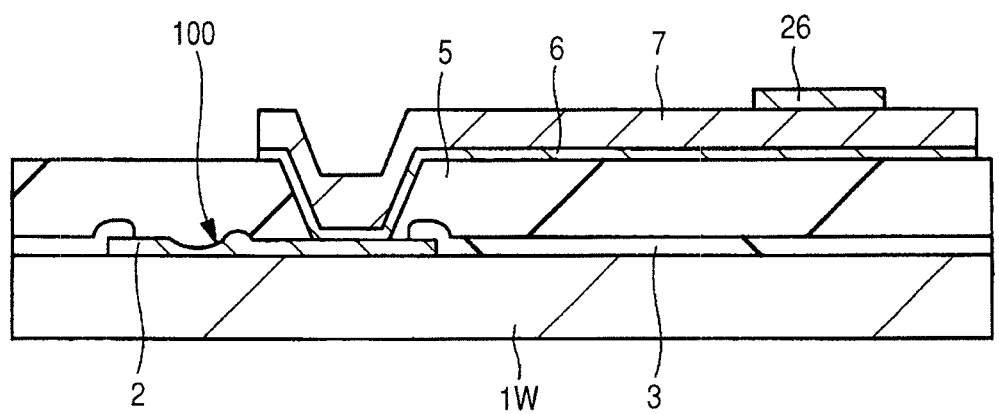
FIG. 24 is a fragmentary cross-sectional schematic of the semiconductor device during a manufacturing step thereof following that of FIG. 23.

FIGS. 23 and 24 are each a fragmentary cross-sectional schematic view of a semiconductor device during manufacturing steps thereof according to this embodiment. The step described referring to FIG. 23 follows the step described in Embodiment 1 referring to FIG. 11 so that steps subsequent thereto will hereinafter be described.

As illustrated in FIG. 23, a resist film formed by the method of application over the semiconductor wafer 1W is patterned by photolithography to form a mask 24 having an opening portion 25 from which a portion of a rewiring layer 7 comprised of, for example, a Cu/Ni film is exposed. Then, a pad 26 made of a conductive film (plating film) is formed by electroplating on the rewiring layer 7. More specifically, the pad 26 is electrically coupled to the rewiring layer 7 and it is made of, for example, an Au film. When the rewiring layer 7 is made of a Cu film, the pad 26 may be made of a Ni/Au film. In addition, a seed film or a plating layer made of, for example, a Pd or Ni film is disposed in order to provide a barrier property against diffusion of Al of the pad material.

As illustrated in FIG. 24, the mask 24 made of the resist film is then removed by asking and with the rewiring layer 7 as a mask, the seed film 6 is wet etched to leave a portion of the seed film 6 below the rewiring layer 7 and remove the other portion of the seed film 6 below the mask 24.

The semiconductor wafer 1W is then cut along the scribe (dicing) region between the device formation regions into individual semiconductor chips, whereby the semiconductor device according to this embodiment is completed. Various semiconductor devices can be formed, for example, by electrically coupling an external terminal to the pad 26 by wire bonding and then sealing the semiconductor chip with a resin. A contact resistance can be reduced by forming an Au film on the surface of the rewiring layer 7, followed by wire bonding to the Au film.

For example, when the entirety of the rewiring layer 7 is made of an Au film, adhesion of it with a molding resin cannot be ensured at the time of fabrication of a package. In this embodiment, therefore, the semiconductor device can have high reliability by forming the pad 26 made of an Au film only at a position where wire bonding is performed.

In the formation step of the pad 26 including an Au film, a thin film formation technology such as electroless plating, sputtering or metal printing can be employed if a mask made of, for example, a resist is formed for the formation of the pad 26 after removal of the seed film 6.

The Ni film below the Au film forms the pad 26 but it may form the rewiring layer 7. The influence of warpage of a wafer (chip) due to the Ni film having a large film stress can be reduced by configuring the pad 26 from the Ni film than by configuring the rewiring layer 7 therefrom.

The pad 26 comprised of a Cu/Ni/Au film may be formed on the rewiring layer made of a Cu film in consideration of interfacial coupling of Cu/Ni.

Embodiment 4

In Embodiments 1 to 3, a conductive film (plating film) is not formed on the pad of a probe region by plating. In this embodiment, on the other hand, a coupling region is extended and a plating film is formed also on the pad of a probe region. Embodiment 4 is similar to Embodiments 1 to 3 except for the above difference.

Figure 25A:
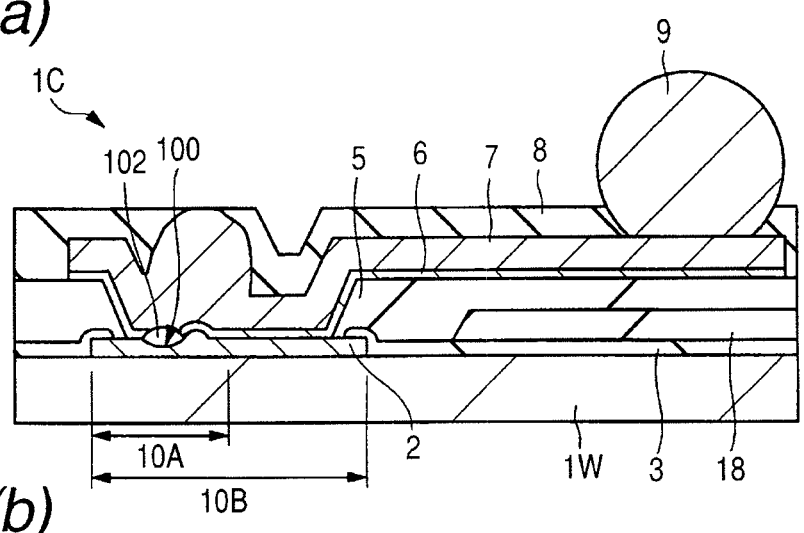
Figure 25B:
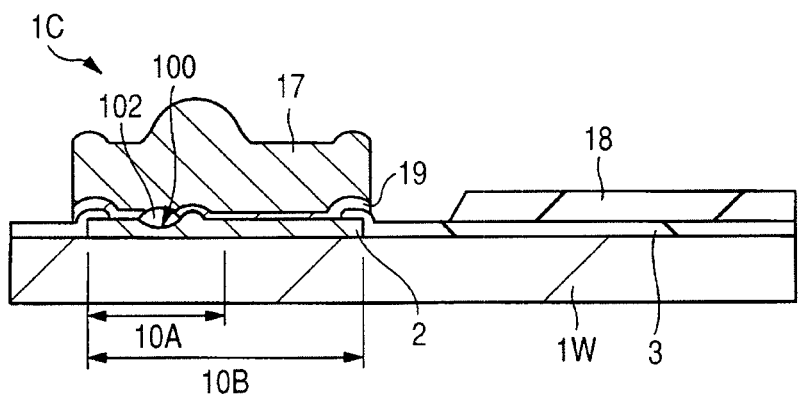
Figure 25C:
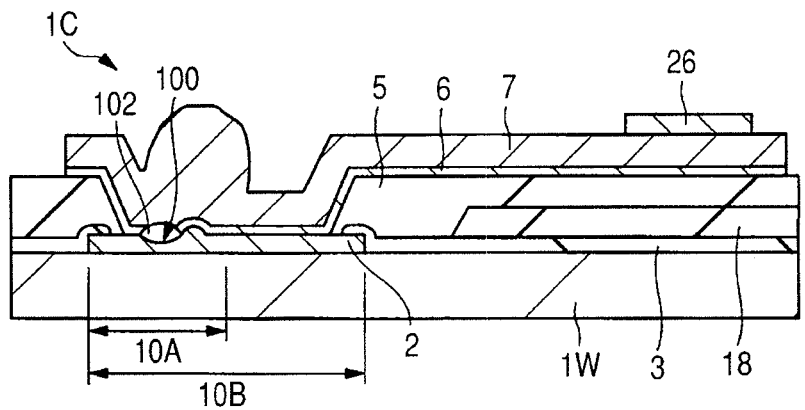
Figure 26:
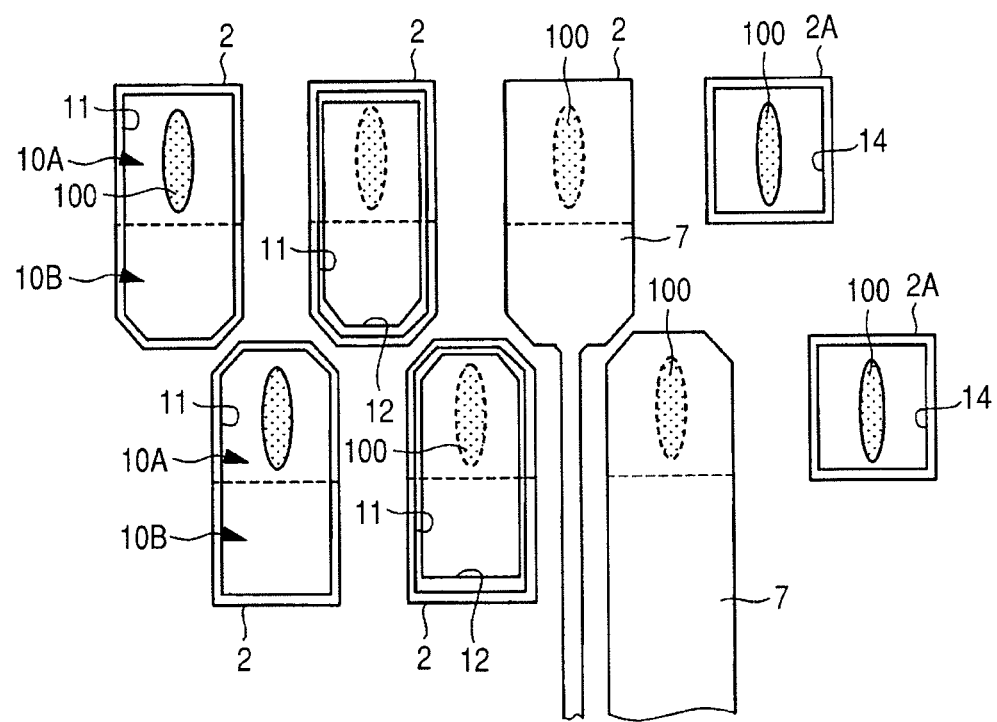
FIG. 26 is a fragmentary schematic plan view of the semiconductor device illustrated in FIG. 25(a)

FIGS. 25(a), 25(b), and 25(c) are fragmentary cross-sectional schematic view of a semiconductor device according to this embodiment, wherein FIG. 25(a) illustrates the structure of a rewiring layer and a solder bump electrode; FIG. 25(b) illustrates the structure of a stud bump; and FIG. 25(c) illustrates the structure of a rewiring layer and a pad. FIGS. 25(a), 25(b), and 25(c) are fragmentary cross-sectional schematic views of the semiconductor device of this embodiment corresponding to those of FIGS. 3, 15 and 24, respectively. FIG. 26 is a fragmentary schematic plan view of the semiconductor device illustrated in FIG. 25(a). FIG. 26 illustrates the device after removal of a portion thereof. The structure of the stud bump electrode illustrated in FIG. 25(b) can be employed also for Au—Au bonding for flip chip mounting, Au-solder bonding, or ACF bonding.

As illustrated in FIG. 25(a) and FIG. 26, a coupling region 10B to which a pad 2 and a rewiring layer 7 are coupled via a seed film 6 includes the probe region 10A to which the probe is brought into contact with the pad 2 in the probe test step. This means that the rewiring layer 7 formed by plating is also laid over the pad 2 in the probe region 10A. This enables to avoid exposure of Al, thereby preventing corrosion of Al configuring the pad 2.

As described referring to FIG. 1, deterioration in the contact property of the seed film 6 due to step difference of the probe mark 100 may deteriorate the flatness of the rewiring layer 7 formed by plating. In the present embodiment, therefore, the contact property between the pad 2 and the rewiring layer 7 is ensured and a flat ratio of the rewiring layer over the pad 2 is improved by widening the area of the pad 2.

Similarly, in FIGS. 25(*b*) and 25(*c*), the contact property between the pad 2 and the plating film (bump electrode 17, rewiring layer 7) can be ensured and a flat ratio of the rewiring layer over the pad 2 can be improved by widening the area of the pad 2.

Embodiment 5

In Embodiment 2, a conductive layer (plating film) made of a single layer is formed over the pad by plating. In the present embodiment, on the other hand, plating is repeated to form a multilayer conductive film. Embodiment 5 is similar to Embodiment 2 except for the above difference.

Figure 27:
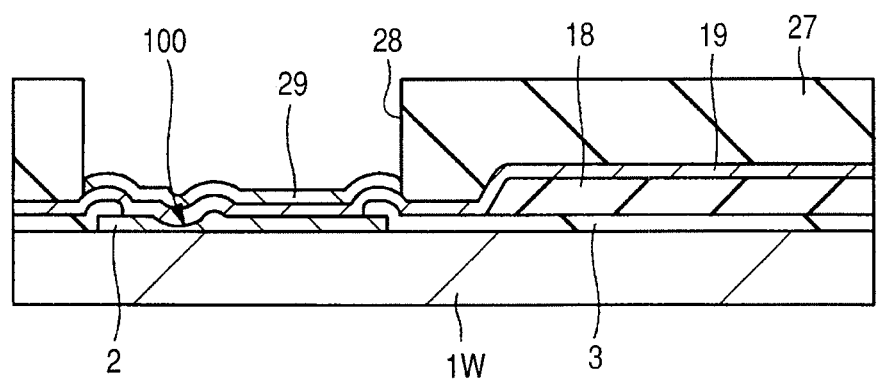
FIG. 27 is a fragmentary cross-sectional schematic view of a semiconductor device during a manufacturing step thereof according to a sixth embodiment of the invention.
Figure 28:
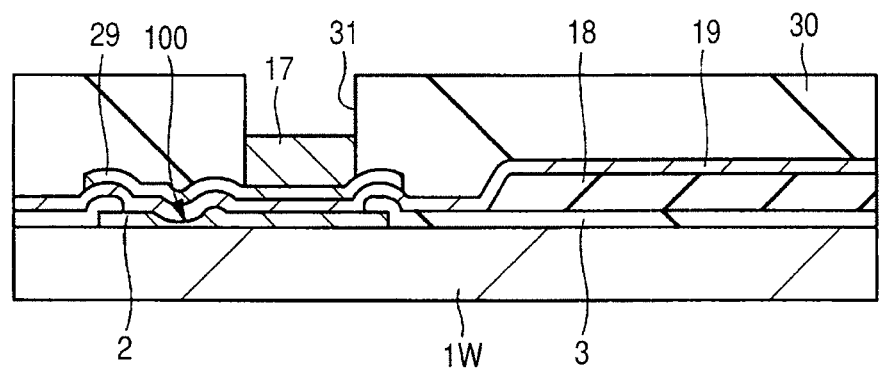
FIG. 28 is a fragmentary cross-sectional schematic view of the semiconductor device during a manufacturing step thereof following that of FIG. 27.
Figure 29:
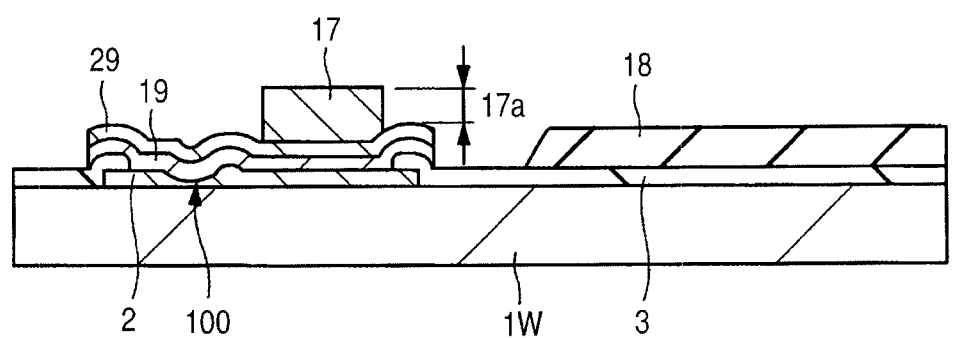
FIG. 29 is a fragmentary cross-sectional schematic view of the semiconductor device during a manufacturing step thereof following that of FIG. 28.

FIGS. 27 to 29 are fragmentary cross-sectional schematic views of a semiconductor device during manufacturing steps thereof according to this embodiment. The step described referring to FIG. 27 follows the step described in Embodiment 2 referring to FIG. 21 so that the steps subsequent thereto will next be described.

As illustrated in FIG. 27, after formation of a resist film over the semiconductor wafer 1W by the method of application, the resist film is patterned by photolithography to form a mask 27 having an opening portion 28 for exposing therefrom a portion of a seed film 19 made of a Cu film. A planar region having this opening portion 28 is greater than the planar region of the pad 2 having an Al film as a main conductive layer.

Then, a conductive film 29 (plating film) is formed on the seed film 19 by electroplating. More specifically, the conductive film 29 is electrically coupled to a pad 2 via the seed film 19 and it is made of, for example, an Au film. The mask 27 made of the resist film is then removed by asking.

As illustrated in FIG. 28, after formation of a resist film over the semiconductor wafer 1W by the method of application, the resist film is patterned by photolithography to form a mask 30 having an opening 31 for exposing therefrom a portion of the conductive film 29 made of the Au film. Then, a bump electrode 17 made of a conductive film (plating film) is formed over the conductive film 29 by electroplating. More specifically, the bump electrode 17 is electrically coupled to the pad 2 and it is made of, for example, an Au film. In this embodiment, the conductive film 29 and the bump electrode 17 are stacked by plating. Then, the mask 30 made of the resist film is removed by ashing.

The planar shape of the bump electrode 17 may be any planar shape insofar as it enables wire bonding from the bump electrode 17. It may be rectangular, polygonal or circular. It is preferably a shape permitting an increase in the contact area (maximum size shape).

As illustrated in FIG. 29, the seed film 19 is then wet etched with the conductive film 29 as a mask to leave a portion of she seed film 19 below the conductive film 29 and remove the other portion of the seed film 19. The semiconductor wafer 1W is then cut along a scribe (dicing) region between partitioned device formation regions into individual semiconductor chips 1G, whereby the semiconductor device according to the present embodiment is completed.

Various semiconductor devices can be fabricated by using the semiconductor device according to this embodiment, electrically coupling an external terminal and the bump electrode 17 by wire bonding. Upon wire bonding, Au—Au bonding can be performed at lower temperature and under a lower load compared with Al—Au bonding so that damage caused by it is lower. In other words, in the present embodiment, wire bonding can be performed at low temperature because the bump electrode 17 made of an Au film is placed on the conductive film 29 made of an Au film. An Al/Au alloy grows and becomes fragile (deteriorates) so that in this embodiment, the formation of an Al/Au alloy is avoided or suppressed by the effect of the seed film or a barrier metal layer made of a plating layer, thereby improving the reliability of wire bonding coupling.

In this embodiment, the conductive film 29 and the bump electrode 17 are stacked by plating. By coating the entire surface of the pad 2 made of Al with the conductive film 29, the pad 2 can have improved resistance to Al corrosion. In addition, the bump electrode 17 is made higher by a height 17*a* than the passivation film 18 serving as a surface protective film, whereby contact of a ball (stitch portion) for wire bonding with the periphery of, for example, the passivation film 18 can be prevented.

Embodiment 6

In Embodiment 1, the limitation of probing property is relaxed by partitioning the pad into the probing region to be probed and the coupling region where the pad and the rewiring layer are coupled and providing sufficient areas for them. In Embodiment 6, the pad is partitioned more definitely into the probe region and the coupling region. Embodiment 6 is similar to Embodiment 1 except for the above difference.

Figure 30A:
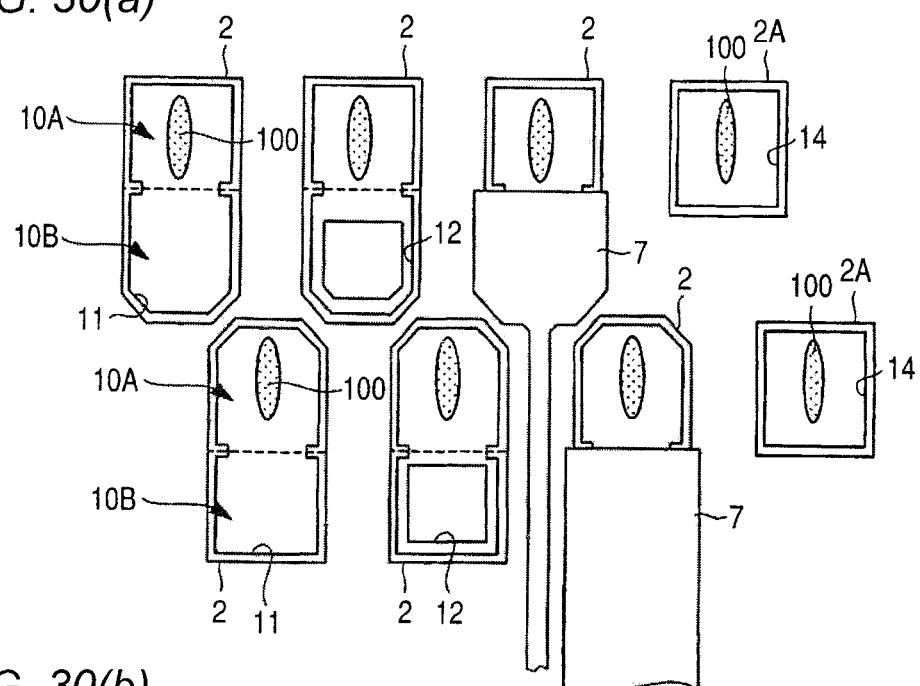
FIGS. 30(*a*) and 30(*b*) are fragmentary schematic plan views of a semiconductor device according to a seventh embodiment of the invention, wherein FIG. 30(*a*) illustrates an opening portion on a pad having a constriction and FIG. 30(*b*) illustrates a separated opening portion.
Figure 30B:
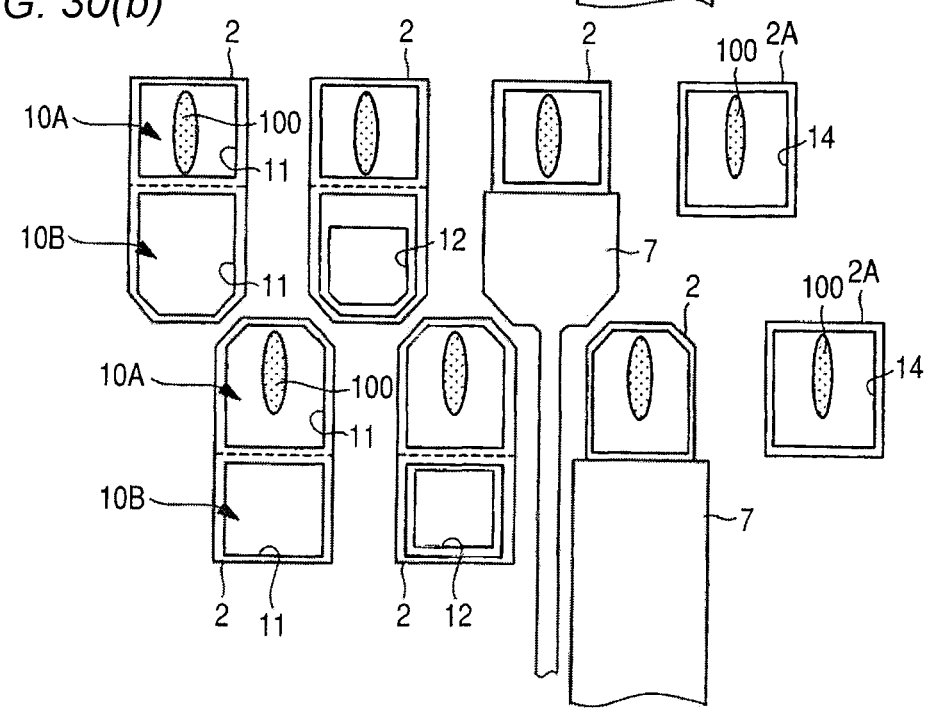

FIGS. 30(*a*) and 30(*b*) are fragmentary schematic plan views of a semiconductor device according to this embodiment, wherein FIG. 30(*a*) illustrates the opening portion 11 on the pad having a constriction and FIG. 30(*b*) illustrates the separated opening portion 11. FIGS. 30(*a*) and 30(*b*) illustrate the device after removal of a portion thereof.

Compared with the configuration as described in Embodiment 1 referring to FIG. 4, the pad is partitioned more definitely into the probe region 10A and the coupling region 10B in which the pad 2 and the rewiring layer 7 are coupled by the opening portion 11 formed in the passivation film 3 (also refer to FIG. 3). This makes it possible to take a more effective measure against loss of the rewiring layer 7 (seed film 6) which is described referring to FIG. 1 and occurs by the influence of the probe mark 100 formed during the probe test step. In addition, exposure of the rewiring layer 7 from the passivation film 8 which is illustrated as the convex portion 101 can be suppressed effectively.

Embodiment 7

In Embodiment 1, the pad has a rectangular planar shape, but in this embodiment, the pad has a convex planar shape. Embodiment 7 is similar to Embodiment 1 except for the above-described difference.

Figure 31A:
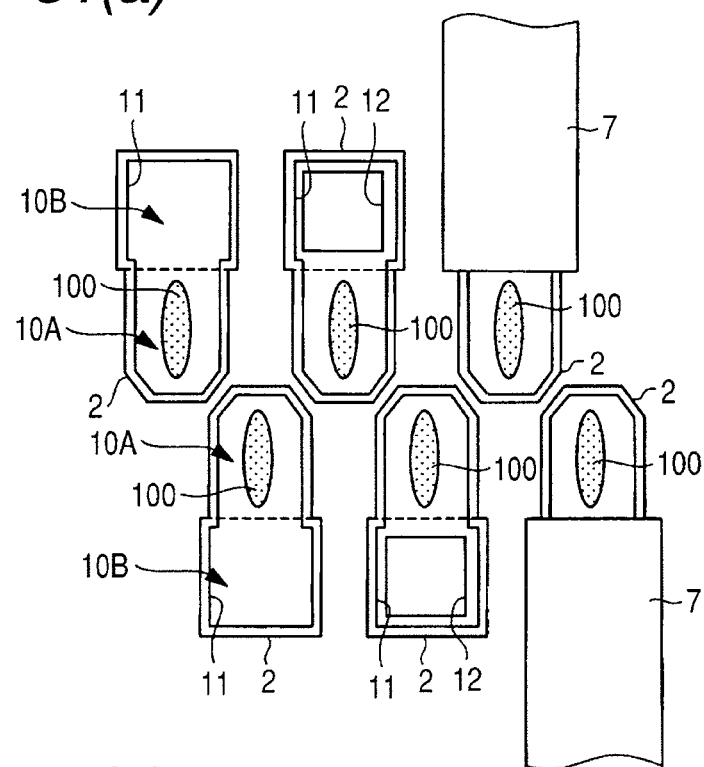
FIGS. 31(*a*) and 31(*b*) are fragmentary schematic plan views of a semiconductor device according to an eighth embodiment of the invention, wherein FIG. 31(*a*) illustrates probe regions arranged in a zigzag manner and FIG. 31(*b*) illustrates probe regions arranged in a straight manner.

FIGS. 31(*a*) and 31(*b*) are fragmentary schematic plan views of a semiconductor device according to this embodiment, wherein FIG. 31(*a*) illustrates the probe regions arranged in a zigzag manner and FIG. 31(*b*) illustrates the probe regions arranged in a straight manner. FIG. 31 illustrates the device after removal of a portion thereof.

In this embodiment, the probe region 10A to be probed is made smaller than the coupling region 10B wherein the pad 2 and the rewiring layer 7 are coupled to each other. For example, when cantilever system probing is employed, a probe needle 4 is brought into contact with the pad while shifting in one direction as described referring to FIG. 8, the probe mark 100 extends in this direction. The probe region 10A therefore needs only a region in one direction to which the probe mark 100 extends. On the other hand, the coupling region 10B must have a sufficient contact area for reducing the contact resistance with the rewiring layer 7 so that it is greater than the region with which the probe needle 4 is brought into contact. As illustrated in FIG. 31, a protruding region (upper portion) of the pad 2 having a convex planar shape is designated as the probe region 10A and the other region (lower portion) is designated as the coupling region 10B.

Thus, by making the area of the probe region 10A to be probed smaller than that of the coupling region 10B wherein the pad 2 and the rewiring layer 7 are coupled, it is possible to achieve size reduction, particularly, narrow pitching of a semiconductor device.

Figure 31B:
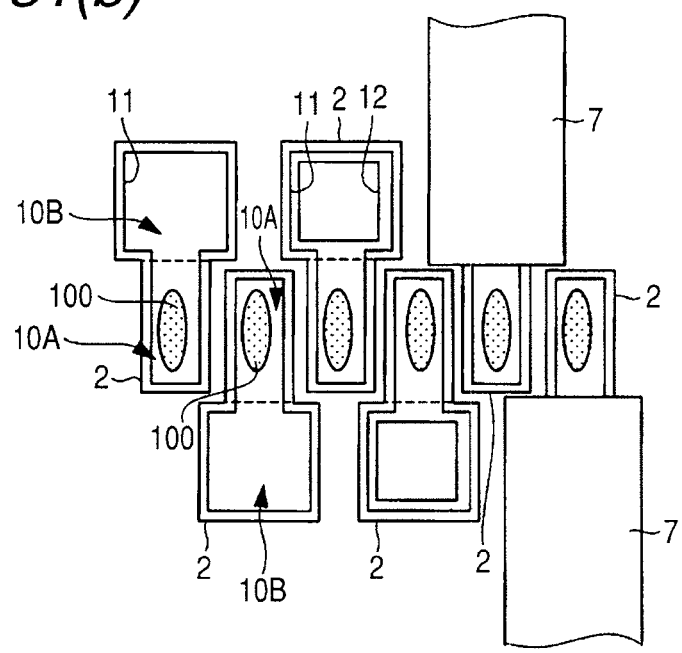

In the case of an area I/O (Input/Output) having a leading space at the periphery, the rewiring layer 7 can be led in both directions. As illustrated in FIG. 31(b), by arranging the probe regions 10A in a straight line, it is possible to achieve size reduction, particularly, narrow pitching of a semiconductor device.

Embodiment 8

In Embodiment 1, the opening portion formed on the pad to couple with the rewiring layer has a square planar shape. In this embodiment, an opening portion having a rectangular planar shape is also described. Embodiment 8 is similar to Embodiment 1 except for the above-described difference.

Figure 32:
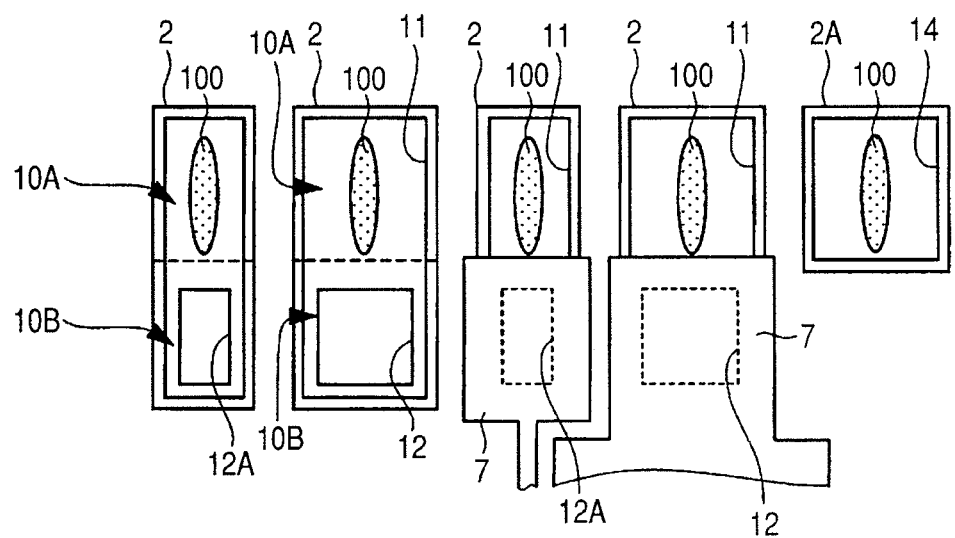
FIG. 32 is a fragmentary schematic plan view of a semiconductor device according to a ninth embodiment of the invention.

FIG. 32 is a fragmentary schematic plan view of a semiconductor device according to this embodiment. FIG. 32 illustrates the device after removal of a portion thereof. n the present embodiment, there are two opening portions, that is, an opening portion 12 having a square planar shape which is similar to the opening portion 12 described in Embodiment 1 referring to FIG. 4 and formed on the pad 2 to couple with the rewiring layer; and a rectangular opening portion 12A smaller than the square opening portion 12. When coupling of the pad 2 and the rewiring layer 7 is not limited to low-resistance coupling, it is possible to achieve size reduction, particularly, pitch narrowing by reducing the size of the opening portion 12A.

It is also possible to achieve size reduction, particularly, pitch narrowing by arranging the coupling via the opening portion 12 and the coupling via the opening portion 12A at intervals of two or more terminals and thereby using the coupling via the opening portion 12 for, for example, power (large current), analogue, or low-resistance coupling and the coupling via the opening portion 12A for high-resistance coupling.

Embodiment 9

In Embodiment 2, the bump electrode is disposed such that it is within the planar region of the pad, while in the present embodiment, a bump electrode protrudes from the planar region of the pad. Embodiment 9 is similar to Embodiment 2 except for the above-described difference.

Figure 33A:
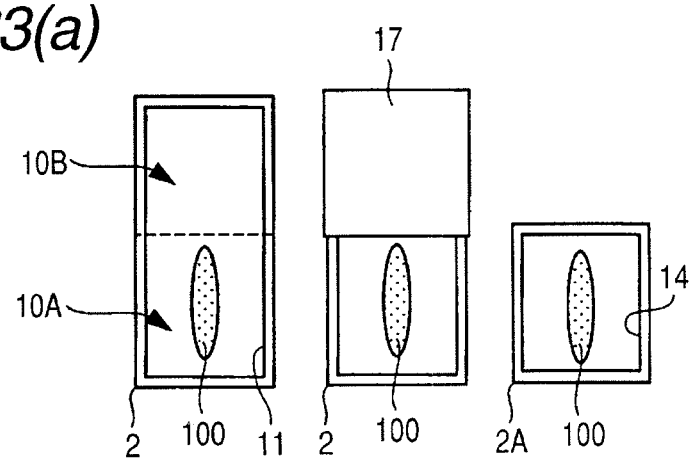
FIGS. 33(*a*), 33(*b*) and 33(*c*) are fragmentary schematic plan views of a semiconductor device according to a tenth embodiment of the invention, wherein FIG. 33(*a*) illustrates a bump electrode having a rectangular planar shape, FIG. 33(*b*) illustrates a bump electrode having a polygonal planar shape, and FIG. 33(*c*) illustrates a bump electrode having a circular planar shape.
Figure 33B:
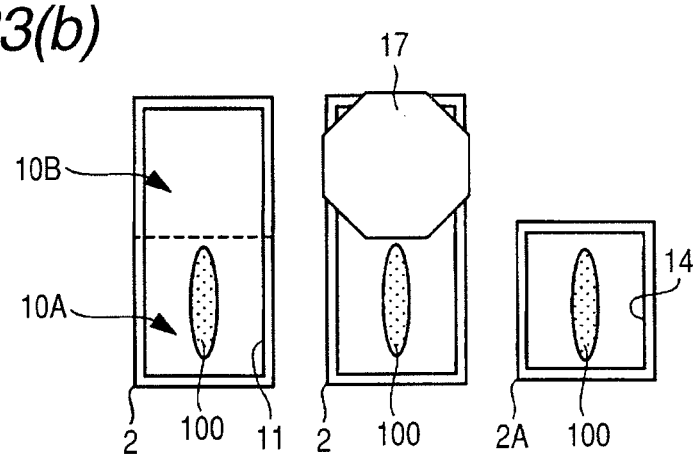
Figure 33C:
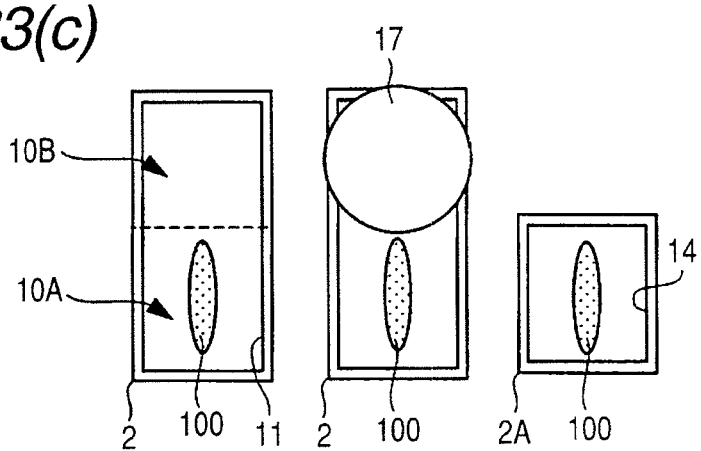

FIGS. 33(a), 33(b) and 33(c) are fragmentary schematic plan views of a semiconductor device according to the present embodiment, wherein FIG. 33(a) illustrates a bump electrode having a rectangular planar shape, FIG. 33(b) illustrates a bump electrode having a polygonal planar shape, and FIG. 33(c) illustrates a bump electrode having a circular planar shape. FIG. 33 illustrates the device after removal of a portion thereof.

The semiconductor device according to this embodiment can be obtained by forming a mask 23 with an opening portion 22 having a planar shape as illustrated in any one of FIGS. 33(a), 33(b) and 33(c) in the step described in Embodiment 2 referring to FIG. 22 and then forming a bump electrode 17 made of, for example, an Au film on the seed film 19 by electroplating.

In the case of a high pin count product, a bump electrode 17 made of an Au film according to the present embodiment is advantageous over a stud bump electrode for wire bonding or flip chip from the viewpoint of securing a coupling area to the outside and relaxing the damage to a low-k layer (interlayer insulating film). When the bump electrode 17 is coupled over the probe mark 100, it is necessary to separate the probe region 10A from the coupling region 10B and completely coupling the bump electrode in the coupling region 10B in order to prevent the problem related to securement of the flatness.

Embodiment 10

In Embodiment 1, the bump electrode made of a solder is formed on a portion of the plating film (rewiring layer) at the position distant from the pad. In the present embodiment, on the other hand, a bump electrode made of a solder is placed on a pad via a plating film. Embodiment 10 is similar to Embodiment 1 except for the above-descried difference.

Figure 34A:
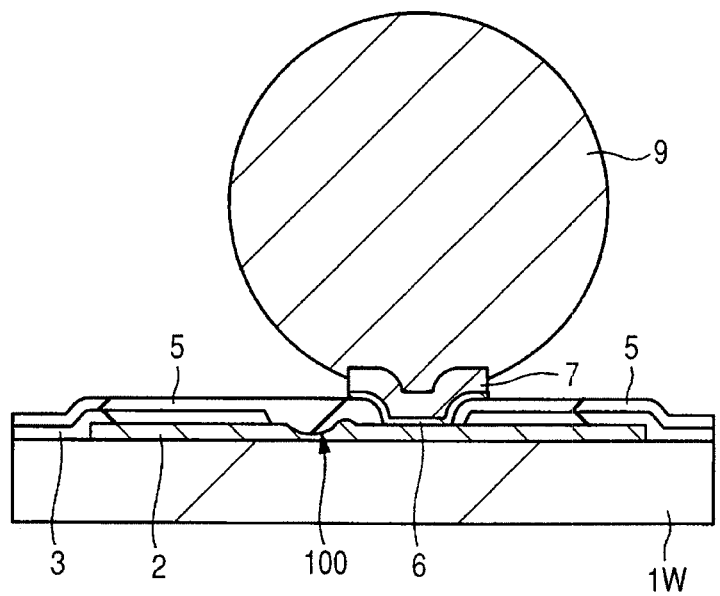
FIGS. 34(*a*) and 34(*b*) are fragmentary cross-sectional schematic views of a semiconductor device according to an eleventh embodiment of the invention, wherein FIG. 34(*a*) illustrates a probe region separated from a coupling region and FIG. 34(*b*) illustrates a coupling region including a probe region.
Figure 34B:
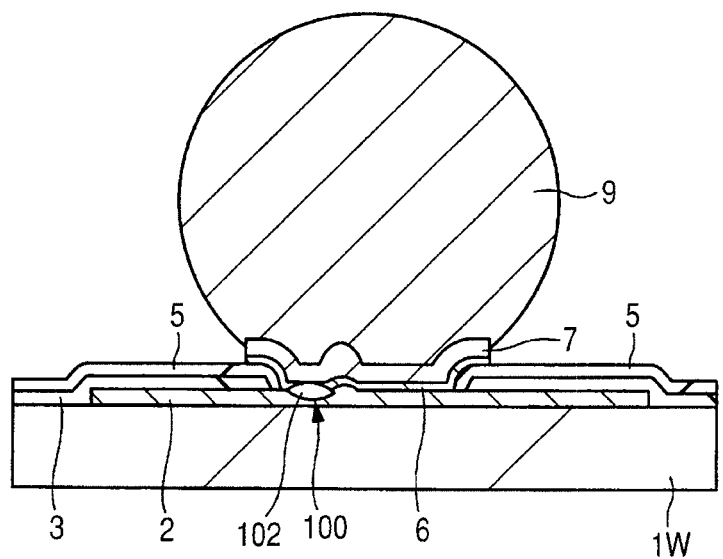

FIGS. 34(a) and 34(b) are fragmentary cross-sectional schematic views of a semiconductor device according to this embodiment, wherein FIG. 34(a) illustrates a probe region 10A separated from a coupling region 10B and FIG. 34(b) illustrates a coupling region 10B including a probe region 10A.

For example when a bump electrode made of a solder is directly formed on a pad 2 made of an Al film, the coupling strength becomes too low to cause deterioration in the reliability of a semiconductor device. As shown in this embodiment, use of a plating film 7 made by plating between the pad 2 made of an Al film and a bump electrode 9 made of a solder enables to ensure the coupling strength and thereby improve the reliability of the semiconductor device.

When the coupling region 10B includes the probe region 10A as illustrated in FIG. 34(b), the coupling region 10B can be made larger than that of FIG. 34(a). Such a configuration can be used for products not capable of exposing the pad 2 made of an Al film.

Embodiment 11

In this embodiment, a compact and high-density SiP (System in Package) is obtained by stacking semiconductor chips by using flip chip and wire bonding technologies.

Figure 35:
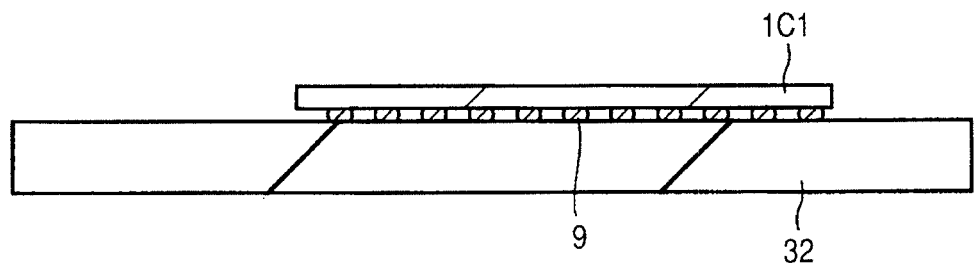
FIG. 35 is a cross-sectional schematic view of a semiconductor device during a manufacturing step thereof according to a twelfth embodiment of the invention.

FIGS. 35 to 39 are cross-sectional schematic views of a semiconductor device during manufacturing steps thereof according to this embodiment. As illustrated in FIG. 35, a semiconductor chip 1C1 as described in Embodiment 1 is flip mounted on one surface side of an insulating substrate 32 made of a glass epoxy resin or a polyimide resin. The insulating substrate 32 has almost a similar shape to that of the semiconductor chip 1C1 but slightly larger. On the surface side of the substrate, a plurality of land electrodes (not illustrated) is formed at a similar positional relationship to bump electrodes 9, in the ball form, of the semiconductor chip 1C1. This means that the bump electrodes 9 of the semiconductor chip 1C1 are electrically coupled to the lands electrodes of the insulating substrate 32 by flip mounting. More specifically, the land electrodes can be electrically coupled to the bump electrodes 9 without causing misalignment because as described in Embodiment 1, the bump electrodes 9 are placed on the rewiring layer led from the pads of a narrow pitch so that a ball diameter can be ensured.

Figure 36:
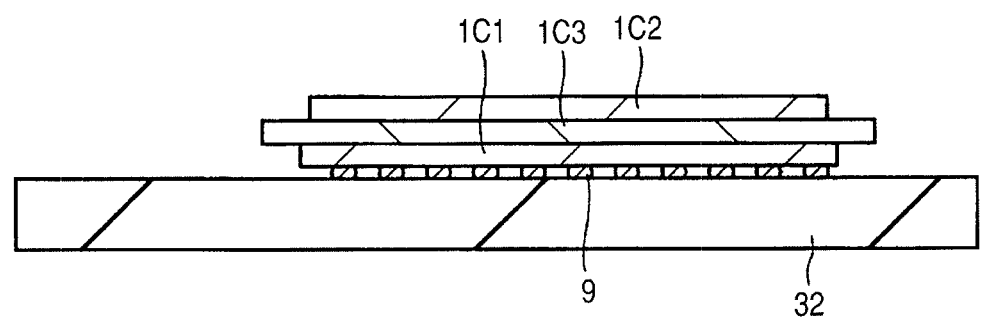
FIG. 36 is a cross-sectional schematic view of the semiconductor device during a manufacturing step thereof following that of FIG. 35.
Figure 37:
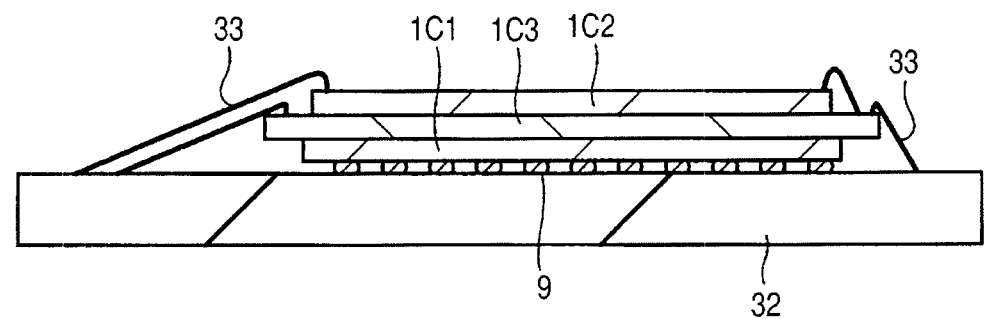
FIG. 37 is a cross-sectional schematic view of the semiconductor device during a manufacturing step thereof following that of FIG. 36.

As illustrated in FIG. 36, a semiconductor chip 1C2 described in Embodiment 2 and a semiconductor chip 1C3 described in Embodiment 3 are stacked one after another over the semiconductor chip 1C with an adhesive material. Then, as illustrated in FIG. 37, the land electrodes on the insulating substrate 32 are electrically coupled to the pads on the semiconductor chips 1C2 and 1C3 via wires 33.

Figure 40:
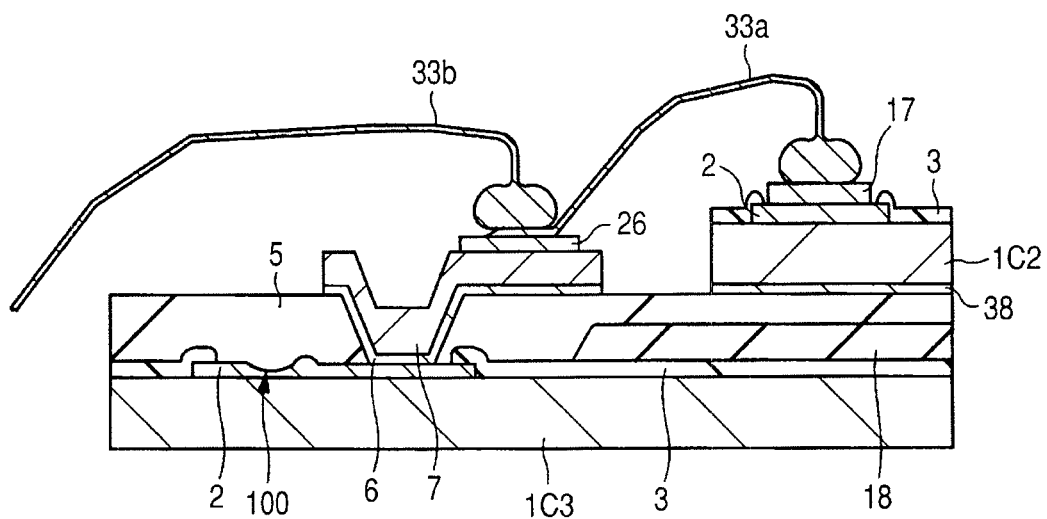
FIG. 40 is a schematic view illustrating one example of wire coupling in a stacked chip.
Figure 41:
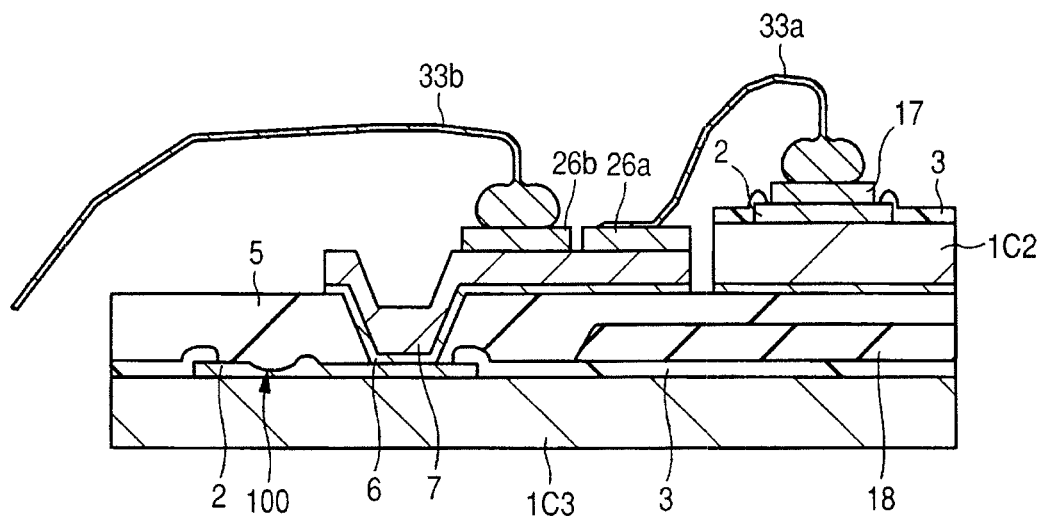
FIG. 41 is a schematic view illustrating another example of wire coupling in a stacked chip.

One example of the coupling of the wire 33 in the stacked chips is illustrated in FIGS. 40 and 41. In FIGS. 40 and 41, the semiconductor chip 1C2 and the semiconductor chip 1C3 are bonded via an adhesive material 36. In FIG. 40, a wire 33a is electrically coupled from the pad 17 of the semiconductor chip 1C2 to the pad 26 of the semiconductor chip 1C3. This means that a ball of the wire 33a is formed on the pad 17 of the semiconductor chip 1C and a stitch of the wire 33a is formed on the pad 26 of the semiconductor chip 1C3. In a conventional manner, a stud bump for wire bonding is formed and then stitching is performed on the stud bump because of difficulty in stitching to the Al pads arranged with a narrow pitch. A wire 33b is electrically coupled to the land electrode on the surface of the insulating substrate 32 from the pad 26 of the semiconductor chip 1C3. This means that a ball of the wire 33b is formed on the stitch formed on the pad 26. By bonding the wires 33a and 33b in such a manner, size reduction of a semiconductor device can be achieved.

In FIG. 41, there is a plurality of wire bonding regions on a rewiring layer 7 of the semiconductor chip 1C3. A wire 33a is electrically coupled from the pad 17 of the semiconductor chip 1C2 to a pad 26a of the semiconductor chip 1C3. This means that a ball of the wire 33a is formed on the pad 17 of the semiconductor chip 1C2 and a stitch of the wire 33a is formed on the pad 26a of the semiconductor chip 1C3. In addition, a wire 33b is electrically coupled from a pad 26b of the semiconductor chip 1C3 to the land electrode on the surface of the insulating substrate 32. This means that a ball of the wire 33b is formed on the pad 26b. Thus, by forming the two pads 26a and 26b separately on the rewiring layer 7 of the semiconductor chip 1C3, wire bonding of the wires 33a and 33b can be performed in a flat region so that good coupling property can be secured. Even if there is a distance between the wires 33a and 33b, they can be electrically coupled via the rewiring layer 7.

Figure 38:
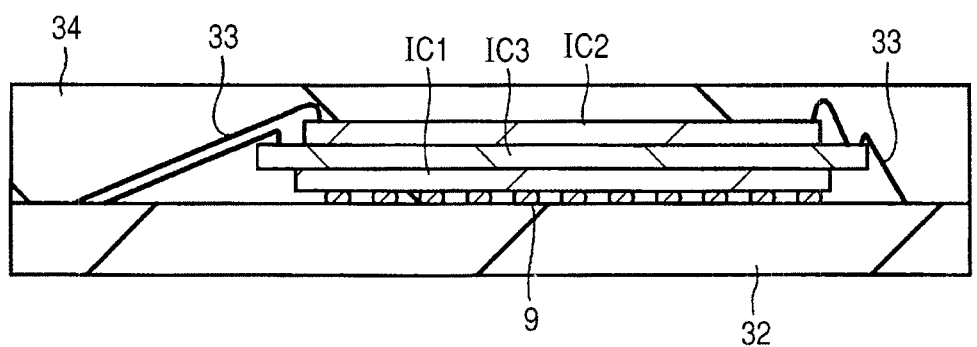
FIG. 38 is a cross-sectional schematic view of the semiconductor device during a manufacturing step thereof following that of FIG. 37.
Figure 39:
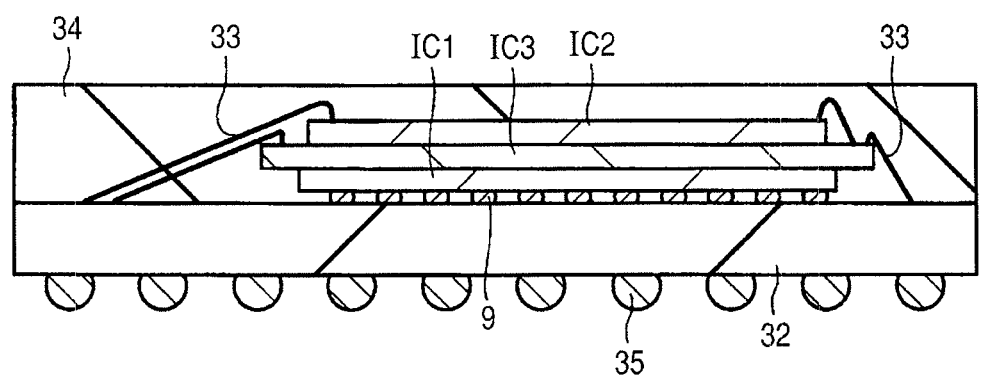
FIG. 39 is a cross-sectional schematic view of the semiconductor device during a manufacturing step thereof following that of FIG. 38.

As illustrated in FIG. 38, the semiconductor chips 1C1, 1C2, and 1C3 are sealed with a resin 34. Then, as illustrated in FIG. 39, ball electrodes 35 to be electrically coupled to the land electrodes on the surface of the insulating substrate 32 are formed on the side opposite to the surface. These ball electrodes 35 are formed with a pitch greater than the pitch between land electrodes such that they correspond to the land electrodes on the surface of the insulating substrate 32. This means that the insulating substrate 32 becomes a so-called interposer substrate.

Thus, a SiP product (semiconductor device) of this embodiment can be completed. Various semiconductor devices can be obtained by mounting the SiP product of this embodiment on a mother substrate. In the method using an interposer, the electrode patterns of a mother substrate may be formed while causing them to correspond to ball electrode patterns of the interposer substrate so that a pitch between electrodes of the mother substrate can be enlarged. As a result, a mother substrate can be formed easily at a low cost.

The invention made by the present inventors was so far described specifically based on some embodiments. It should however be borne in mind that the invention is not limited to or by them. It is needless to say that various modifications or changes are possible without departing from the gist thereof.

For example, in the above embodiments, a cantilever system probe is employed for the probe test step, but it can be replaced by a vertically movable system.

In the above embodiments, the probe test step is followed by coupling of the conductive member to the coupling region. The order is not limited to it. For example, a product which must avoid application of a heat load thereto in the passivation, seed, resist or plating step after a probe test (a product from which ROM write to be performed in the probe step disappears or a product requiring fuse cut (switching of a memory bit, adjustment of variations in resistance)), probing is performed preferably after formation of a bump electrode (Au plating). When the probe test step is performed after formation of a conductive member, Cu may be used as a material of the pad because a probe needle is not brought into contact with the pad.

When the conductive member is coupled to the coupling region prior to the probe test step, there is a fear of the surface of the coupling region being contaminated due to the influence of a heat load during the probe test step. It is therefore recommended to clean the surface of the coupling region.

The present invention is utilized widely in the manufacturing industry of semiconductor devices having a conductive film formed on a pad after a probe test step, which is performed by bringing a probe needle to the pad. The invention can be applied to products with a narrow pitch, for example, mobile products, navigation products, in-vehicle products and analog products having electrical properties capable of satisfying severe requirements.

The invention claimed is:

1. A method of manufacturing a semiconductor device, comprising the steps of:
   (a) providing a semiconductor wafer including a plurality of device formation regions, each device formation region having a semiconductor circuit, a pad electrically coupled to the semiconductor circuit, and a first insulating film formed on the pad such that a surface portion of the pad is exposed from the first insulating film at a first opening of the first insulating film;
   (b) after the step (a), forming a second insulating film on the first insulating film such that the surface portion of the pad is exposed from the second insulating film at a second opening of the second insulating film;
   (c) after the step (b), bringing a probe needle into contact with the surface portion of the pad; and
   (d) after the step (c), forming an interconnect layer on the second insulating film, and electrically coupling the interconnect layer to the pad at the surface portion, wherein in the step (b), the second insulating film is formed with application of a heat load to the semiconductor wafer.

2. The method according to claim 1, wherein in the step (a), the first insulating film is formed with application of a heat load to the semiconductor wafer.

3. The method according to claim 2, wherein in the step (c), the probe needle is brought into contact with the surface portion of the pad in order to conduct a ROM write to the semiconductor circuit.

4. The method according to claim 3,
wherein the first insulating film is made of an inorganic insulating film, and
wherein the second insulating film is made of an organic insulating film.

5. The method according to claim 4,
wherein the first insulating film is made of silicon nitride, and
wherein the second insulating film is made of polyimide.

6. The method according to claim 5,
wherein the pad is comprised of Al, and
wherein the interconnect layer is comprised of:
a seed layer made of one of a Pd/Ti film, a Ti film, and a TiN film, and
a rewiring layer formed on the seed layer, and made of one of a Cu film and a Ni/Cu film.

7. The method according to claim 6,
wherein, in the step (c), the probe needle is brought into contact with the pad at a first region of the surface portion,
wherein, in the step (d), the interconnect layer is electrically coupled to the pad at a second region of the surface portion, which is different from the first region.

8. The method according to claim 7, further comprising the steps of:
(e) after the step (d), electrically coupling a conductive member to one end portion of the interconnect layer, an opposite end portion of the interconnect layer being electrically coupled to the pad at the second region of the surface portion;
(f) after the step (e), cutting the semiconductor wafer along a scribe region between the plurality of device formation regions, which are adjacent to each other, so as to divide the semiconductor wafer into a plurality of semiconductor chips; and
(g) after the step (f), mounting one of the plurality of semiconductor chips on a substrate.

9. The method according to claim 8, wherein the conductive member is a bump electrode.

10. The method according to claim 7, further comprising the steps of:
(e) after the step (d), cutting the semiconductor wafer along a scribe region between the plurality of device formation regions, which are adjacent to each other, so as to divide the semiconductor wafer into a plurality of semiconductor chips;
(f) after the step (e), mounting one of the plurality of semiconductor chips on a substrate; and
(g) after the step (f), electrically coupling a conductive member to one end portion of the interconnect layer of the one of the plurality of semiconductor chips, an opposite end portion of the interconnect layer being electrically coupled to the pad at the second region of the surface portion.

11. The method according to claim 10, wherein the conductive member is a wire.

* * * * *